US009202901B2

(12) United States Patent
Fu et al.

(10) Patent No.: US 9,202,901 B2
(45) Date of Patent: Dec. 1, 2015

(54) METAL SILICIDE SELF-ALIGNED SIGE HETEROJUNCTION BIPOLAR TRANSISTOR AND METHOD OF FORMING THE SAME

(71) Applicant: Tsinghua University, Beijing (CN)

(72) Inventors: Jun Fu, Beijing (CN); Yu-dong Wang, Beijing (CN); Wei Zhang, Beijing (CN); Gao-qing Li, Beijing (CN); Zheng-li Wu, Beijing (CN); Jie Cui, Beijing (CN); Yue Zhao, Beijing (CN); Zhi-hong Liu, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 14/189,106

(22) Filed: Feb. 25, 2014

(65) Prior Publication Data

US 2014/0175520 A1 Jun. 26, 2014

Related U.S. Application Data

(62) Division of application No. 13/625,233, filed on Sep. 24, 2012, now abandoned.

(30) Foreign Application Priority Data

| May 22, 2012 | (CN) | 2012 1 0160790 |
| May 22, 2012 | (CN) | 2012 1 0160811 |
| May 22, 2012 | (CN) | 2012 1 0161096 |
| May 22, 2012 | (CN) | 2012 1 0161177 |
| May 22, 2012 | (CN) | 2012 1 0161187 |
| May 22, 2012 | (CN) | 2012 1 0161189 |

(51) Int. Cl.
*H01L 29/737* (2006.01)
*H01L 29/66* (2006.01)
(Continued)

(52) U.S. Cl.
CPC ...... *H01L 29/7378* (2013.01); *H01L 29/66242* (2013.01); *H01L 29/66318* (2013.01)

(58) Field of Classification Search
CPC ............. H01L 29/7371; H01L 29/66242; H01L 29/0821; H01L 29/7378; H01L 29/1004
USPC ............ 257/197, 565, 51; 438/318, 312, 309, 438/311
See application file for complete search history.

(56) References Cited

U.S. PATENT DOCUMENTS 7,892,915 B1 * 2/2011 Ramdani ............ H01L 21/02529
257/19
2005/0242373 A1 11/2005 Ahlgren et al.
(Continued)

*Primary Examiner* — Vongsavanh Sengdara
*Assistant Examiner* — Thai T Vuong
(74) *Attorney, Agent, or Firm* — Renner, Otto, Boissell & Sklar, LLP

(57) ABSTRACT

The present invention discloses a metal silicide self-aligned SiGe heterojunction bipolar transistor, which is designed to overcome the shortcomings such as the large base resistance $R_B$ of the prior art products. The metal silicide self-aligned SiGe heterojunction bipolar transistor of the present invention mainly comprises an Si collector region, a local dielectric region, a base region, a base-region low-resistance metal silicide layer, a polysilicon emitter region, an emitter-base spacer dielectric region composed of a liner silicon oxide layer and a silicon nitride inner sidewall, a monocrystalline emitter region, a contact hole dielectric layer, an emitter metal electrode and a base metal electrode. The base-region low-resistance metal silicide layer extends all the way to the outside of the emitter-base spacer dielectric region. The present invention discloses a method of forming a metal silicide self-aligned SiGe heterojunction bipolar transistor, which is used to form the aforesaid bipolar transistor. The metal silicide self-aligned SiGe heterojunction bipolar transistor and the method of forming the same of the present invention can reduce the base resistance $R_B$, and feature a simple process and a low cost.

28 Claims, 17 Drawing Sheets

(51) Int. Cl.
*H01L 29/73* (2006.01)
*H01L 29/165* (2006.01)
*H01L 21/265* (2006.01)

(56) References Cited

U.S. PATENT DOCUMENTS

| | | | | |
|---|---|---|---|---|
| 2008/0121930 A1* | 5/2008 | Adam | ................ | H01L 29/0821 257/190 |
| 2008/0296623 A1* | 12/2008 | Wilhelm | ........... | H01L 29/66242 257/197 |
| 2009/0173970 A1* | 7/2009 | Adam | ............... | H01L 21/82285 257/197 |
| 2009/0179228 A1* | 7/2009 | Joseph | ................ | H01L 29/0817 257/197 |
| 2009/0184423 A1* | 7/2009 | Erturk | ............... | H01L 21/76898 257/751 |
| 2009/0206370 A1* | 8/2009 | Chu | ........................ | H01L 29/45 257/197 |
| 2009/0224286 A1* | 9/2009 | Adam | .................... | H01L 29/161 257/191 |
| 2010/0127352 A1 | 5/2010 | El-Diwany et al. | | |
| 2010/0283084 A1* | 11/2010 | Ohnishi | .............. | H01L 29/0821 257/197 |
| 2012/0112244 A1* | 5/2012 | Camillo-Castillo | | H01L 29/7375 257/197 |
| 2012/0132961 A1* | 5/2012 | Vanhoucke | ......... | H01L 29/0821 257/197 |
| 2012/0139009 A1* | 6/2012 | Ning | ..................... | H01L 29/7317 257/197 |
| 2013/0119434 A1* | 5/2013 | Adkisson | ........... | H01L 29/7371 257/197 |

* cited by examiner

US 9,202,901 B2

METAL SILICIDE SELF-ALIGNED SIGE HETEROJUNCTION BIPOLAR TRANSISTOR AND METHOD OF FORMING THE SAME

BACKGROUND OF THE INVENTION

1. Technical Field

The present invention relates to a metal silicide self-aligned SiGe heterojunction bipolar transistor and a method of forming the same.

2. Description of Related Art

Planar silicon (Si) bipolar transistors are conventional devices for constructing analog integrated circuits (ICs). However, because silicon materials are inherently disadvantageous in speed, group III-V compound (e.g., gallium arsenide) semiconductor devices have always dominated in the field of high-frequency and high-speed applications in the history. For SiGe heterojunction bipolar transistors obtained by introducing narrow-bandgap SiGe alloys into silicon bipolar transistors as materials of base regions, not only the high-frequency performance is improved significantly but also the advantage of the low cost of the silicon-based technology is maintained. Therefore, the SiGe heterojunction bipolar transistors have been widely used in the field of radio frequency (RF), microwave and high-speed semiconductor devices and ICs, and have partially replaced the compound (e.g., gallium arsenide) semiconductor technologies.

The base resistance $R_B$ and the collector-base capacitance $C_{BC}$ of a bipolar transistor have always been primary parasitic parameters that restrict further improvement of the high-frequency performance of the device, and the influence of the base resistance $R_B$ and the collector-base capacitance $C_{BC}$ on the high-frequency performance index of the device can be described by using the following simplified expression:

$$f_{max} = \sqrt{\frac{f_T}{8\pi R_B C_{BC}}}$$

where $f_T$ and $f_{max}$ represent the cut-off frequency and the maximum oscillation frequency of the device respectively.

Furthermore, the base resistance $R_B$ is also the primary source of thermal noises of the bipolar transistor. Therefore, in order to improve the high-frequency performance and the noise performance of the device, reducing the base resistance $R_B$ is always one of important tasks for optimization of bipolar transistor devices and processes.

One of effective means to reduce the base resistance $R_B$ is to use the emitter region-extrinsic base region self-aligned structure (i.e., to ensure that the space between the heavily doped extrinsic base region and the emitter region of the device is not determined by and is generally much smaller than the minimum line width or the minimum overlay space permitted by photolithography).

For a heterojunction bipolar transistor with the SiGe base region formed through an epitaxy growth process, the device structure with a self-aligned elevated extrinsic base region satisfies the requirements of self-alignment between the heavily doped extrinsic base region and the emitter region and, thus, becomes a standard device structure for the current high-performance self-aligned SiGe heterojunction bipolar transistor process. Processes for achieving such a device structure with the self-aligned elevated extrinsic base region may be generally divided into two kinds One kind features that the self-aligned elevated extrinsic base region is formed after the intrinsic base epitaxy growth, with the self-aligned architecture achieved mainly with help of some sort of planarization process. The other kind of process achieves such a device structure in the following way: firstly, depositing a heavily doped polycrystalline elevated extrinsic base region; then, opening the emitter window through photolithography and etching; finally, growing a intrinsic base epitaxial layer inside the formed emitter window through a selective epitaxy process, joining the intrinsic base epitaxial layer with the polycrystalline cantilevers of the pre-formed heavily doped elevated extrinsic base region.

The above two kinds of technical solutions have a common shortcoming that the processes are complex. The former technical solution requires use of expensive special planarization apparatuses and processes; and the latter technical solution may cause process quality control problems (e.g., some defects such as voids may be formed in the linkup base region between the pre-formed extrinsic base region and the intrinsic base region that is grown through the selective epitaxy process) because the intrinsic base region playing a decisive role in the device performance need be grown through the selective epitaxy process which is difficult to control. Therefore, up to now, the device structure of the SiGe heterojunction bipolar transistor with a self-aligned elevated extrinsic base region and the process of forming the same still need be improved.

BRIEF SUMMARY OF THE INVENTION

To overcome the aforesaid shortcomings, the present invention provides a metal silicide self-aligned SiGe heterojunction bipolar transistor, which features a simple process and a reduced base resistance $R_B$.

The present invention provides a metal silicide self-aligned SiGe heterojunction bipolar transistor, which mainly comprises Si collector region, local dielectric region, base region, base-region low-resistance metal silicide layer, polysilicon emitter region, emitter-base spacer dielectric region, monocrystalline emitter region beneath an emitter window enclosed by the emitter-base spacer dielectric region, contact hole dielectric layer, emitter metal electrode and base metal electrode. Particularly, the emitter-base spacer dielectric region is composed of liner silicon oxide layer and silicon nitride inner sidewall, and the base-region low-resistance metal silicide layer extends all the way to the outside of the emitter-base spacer dielectric region, and the base region comprises a monocrystalline base region, a heavily doped monocrystalline base region and a polycrystalline base region. and the base region is located above the Si collector region and the local dielectric region, and the polysilicon emitter region and the emitter-base spacer dielectric region are located above the monocrystalline base region, and the base-region low-resistance metal silicide layer is located on the surface of the base region, further, and the transistor may additionally comprise polysilicon-emitter-region low-resistance metal silicide layer that is located on the surface of the polysilicon emitter region.

Optionally, the base region comprises a monocrystalline base region, a polycrystalline base region and a polysilicon elevated extrinsic base region, and the monocrystalline base region and the polycrystalline base region are located above the Si collector region and the local dielectric region, and the polysilicon emitter region and the emitter-base spacer dielectric region are located above the monocrystalline base region, and the base-region low-resistance metal silicide layer is located on the surface of the polycrystalline base region and a portion of the monocrystalline base region, and the polysilicon elevated extrinsic base region is located above the base-region low-resistance metal silicide layer, further, and the transistor may additionally comprise emitter-region low-resistance metal silicide layer that is located on the surface of the polysilicon emitter region and extrinsic-base-region low-resistance metal silicide layer that is located on the surface of the polysilicon elevated extrinsic base region.

On the other hand, the present invention provides a method of forming a metal silicide self-aligned SiGe heterojunction bipolar transistor, which comprises at least the following steps:

6.1 forming a Si epitaxial layer of a first conduction type, and forming the local dielectric region in the resulting Si epitaxial layer, wherein the portion of the Si epitaxial layer in which the local dielectric region is not formed is the Si collector region;

6.2 forming the base region of a second conduction type on the resulting structure of the step 6.1, forming the monocrystalline base region on top of the Si collector region, and forming the polycrystalline base region on top of the local dielectric region, wherein the base region is a composite layer consisting of Si and SiGe;

6.3 depositing or sputtering a first metal layer;

6.4 depositing a first silicon oxide layer;

6.5 selectively removing middle portion of the first silicon oxide layer and the first metal layer in sequence to form a first window which exposes the middle portion of the surface of the monocrystalline base region;

6.6 depositing a second silicon oxide layer;

6.7 depositing a silicon nitride layer and then forming the silicon nitride inner sidewall at the inner edge of the first window through an anisotropic etching process;

6.8 removing the portion of the second silicon oxide layer which are not covered by the silicon nitride sidewall to form the emitter-base spacer dielectric region comprised of the liner silicon oxide layer and the silicon nitride inner sidewall, opening the emitter window enclosed by the emitter-base spacer dielectric region to expose the middle portion of the surface of the monocrystalline base region;

6.9 depositing a polysilicon layer and heavily doping the polysilicon layer into a polysilicon layer of the first conduction type;

6.10 forming a protection layer on the polysilicon layer and then etching off portion of the polysilicon layer and the first silicon oxide layer which are not masked by the protection layer to form the heavily doped polysilicon emitter region of the first conduction type;

6.11 implanting ions of the second conduction type into the resulting structure of the step 6.10 to form the heavily doped monocrystalline base region and the heavily doped polycrystalline base region of the second conduction type by using the protection layer as a mask, and then removing the protection layer;

6.12. enabling the first metal layer to make a silicification reaction with the heavily doped polycrystalline base region, the heavily doped monocrystalline base region and a portion of the monocrystalline base region, which are all in contact with the first metal layer, respectively to obtain the base-region low-resistance metal silicide layer; and diffusing the impurities in the heavily doped polysilicon emitter region of the first conduction type formed in the step 6.10 outwards and downwards via the emitter window to form the heavily doped monocrystalline emitter region of the first conduction type; and 6.13. depositing a hole dielectric layer, and forming the contact holes, and leading out the emitter metal electrode and the base metal electrode.

Optionally, the step 6.12 may be replaced by the following steps:

6.12.1 depositing a third silicon oxide layer and then forming the silicon oxide outer sidewall through an anisotropic etching process;

6.12.2 depositing or sputtering a second metal layer; and 6.12.3 enabling the first metal layer to make a silicification reaction with the heavily doped polycrystalline base region, the heavily doped monocrystalline base region and a portion of the monocrystalline base region, which are all in contact with the first metal layer, respectively to obtain the base-region low-resistance metal silicide layer; enabling the second metal layer to make a silicification reaction with the polysilicon emitter region to form a polysilicon-emitter-region low-resistance metal silicide layer; removing the portion of the second metal layer which makes contact with the silicon oxide outer sidewall and has not made the silicification reaction; and diffusing the impurities in the heavily doped polysilicon emitter region of the first conduction type formed in the step 6.10 outwards and downwards via the emitter window to form the heavily doped monocrystalline emitter region of the first conduction type.

On the further other hand, the present invention provides a method of forming a metal silicide self-aligned SiGe heterojunction bipolar transistor, which comprises at least the following steps:

8.1 forming a Si epitaxial layer of a first conduction type and forming the local dielectric region in the resulting Si epitaxial layer, wherein a portion of the Si epitaxial layer in which the local dielectric region is not formed is the Si collector region;

8.2 forming the base region of a second conduction type on the resulting structure of the step 8.1, forming a monocrystalline base region on top of the Si collector region, and forming a polycrystalline base region on top of the local dielectric region, wherein the base region is a composite layer consisting of Si and SiGe;

8.3 depositing or sputtering a first metal layer;

8.4 depositing a first polysilicon layer to form a heavily doped first polysilicon layer of the second conduction type, and depositing a first silicon oxide layer on the first polysilicon layer;

8.5 selectively removing the middle portion of the first silicon oxide layer, the first polysilicon layer and the first metal layer in sequence to form a first window which exposes the middle portion of the surface of the monocrystalline base region, with the remaining portion of the first polysilicon layer forming a polysilicon elevated extrinsic base region;

8.6 depositing a second silicon oxide layer;

8.7 depositing a silicon nitride layer and then forming the silicon nitride inner sidewall at the inner edge of the first window through an anisotropic etching process;

8.8 removing the portion of the second silicon oxide layer which are not covered by the silicon nitride sidewall to form an emitter-base spacer dielectric region comprised of the remaining second silicon oxide layer, named the liner silicon oxide layer, and the silicon nitride inner sidewall, opening the emitter window enclosed by the emitter-base spacer dielectric region to expose the middle portion of the surface of the monocrystalline base region;

8.9 depositing a second polysilicon layer and heavily doping the second polysilicon layer into a polysilicon layer of the first conduction type;

8.10 etching off part of the second polysilicon layer and part of the first silicon oxide layer to form the heavily doped polysilicon emitter region of the first conduction type;

8.11 enabling the metal layer to make a silicification reaction with the polycrystalline base region, a portion of the monocrystalline base region and the polysilicon elevated extrinsic base region, which are in contact with the metal layer, respectively to obtain the base-region low-resistance metal silicide layer; and diffusing the impurities in the heavily doped polysilicon emitter region of the first conduction type formed in the step 8.10 outwards and downwards via the emitter window to form the heavily doped monocrystalline emitter region of the first conduction type; and 8.12 depositing a contact hole dielectric layer, and forming contact holes, and leading out the emitter metal electrode and the base metal electrode.

Particularly, the step 8.11 of forming the base-region low-resistance metal silicide layer and the heavily doped monocrystalline emitter region comprises:

8.11.1 forming a silicon oxide outer sidewall outside the polysilicon emitter region and remaining portion of the first silicon oxide layer by depositing a silicon oxide layer firstly and then carrying out an anisotropic etching process on the silicon oxide layer;

8.11.2 depositing or sputtering a second metal layer on the resulting structure of the step 8.11.1; and 8.11.3 enabling the first metal layer to make a silicification reaction with the polycrystalline base region, a portion of the monocrystalline base region and the polysilicon elevated extrinsic base region, which are in contact with the first metal layer, respectively to obtain the base-region low-resistance metal silicide layer; enabling the second metal layer to make a silicification reaction with the heavily doped polysilicon elevated extrinsic base region in contact with the second metal layer to obtain the extrinsic-base-region low-resistance metal silicide layer, and to make a silicification reaction with the polysilicon emitter region in contact with the second metal layer to form the emitter-region low-resistance metal silicide layer; and diffusing the impurities in the heavily doped polysilicon emitter region of the first conduction type formed in the step 8.10 outwards and downwards via the emitter window to form the heavily doped monocrystalline emitter region of the first conduction type.

Particularly, the local dielectric region is formed in the Si epitaxial layer by grooving the Si epitaxial layer and then filling a dielectric material therein or through local oxidization.

Particularly, the metal layers are made of Ti, Co or Ni.

Particularly, the second silicon oxide layer has a thickness ranging between 5 nm and 50 nm.

Particularly, the silicon nitride inner sidewall is formed by firstly depositing the silicon nitride layer and then carrying out the anisotropic etching process on the silicon nitride layer, and the inner sidewall has a width ranging between 10 nm and 500 nm.

Particularly, the polysilicon layer is heavily doped into the polysilicon layer of the first conduction type by using an in-situ doping process during deposition of the polysilicon layer or by using an ion implantation process at a dosage greater than $10^{14}/cm^2$ after deposition.

Particularly, the base-region low-resistance metal silicide layer, the extrinsic-base-region low-resistance metal silicide layer and/or the emitter-region low-resistance metal silicide layer are formed by using a rapid thermal annealing process one or more times; and the heavily doped monocrystalline emitter region is formed by using the one or more times of the rapid thermal annealing process, or by using a rapid thermal annealing process or some other thermal diffusion drive-in process before or after the one or more times.

For the metal silicide self-aligned SiGe heterojunction bipolar transistor of the present invention, the base-region low-resistance metal silicide layer extends all the way to the outside of the emitter-base spacer dielectric region so that the distance from the base-region low-resistance metal silicide layer to the heavily doped monocrystalline emitter region is equal to (in consideration of lateral diffusion as well as downward diffusion of the impurities in the heavily doped polysilicon emitter region and lateral growth of the base-region low-resistance metal silicide layer, this distance shall be slightly smaller than) the width of the emitter-base spacer dielectric region comprised of the liner silicon oxide layer and the silicon nitride inner sidewall (i.e., a sum of the thickness of the liner silicon oxide layer and the width of the silicon nitride inner sidewall). As can be seen, this distance is not limited by the minimum overlay space permitted by photolithography, and can be reduced sufficiently by optimizing the process. That is, achieving the device structure of the self-aligned SiGe heterojunction bipolar transistor can reduce the base resistance of the device effectively.

Even though the polysilicon elevated extrinsic base region of the device of the present invention is doped through ion implantation, it can be ensured that a damaged region caused by the ion implantation is far away from the monocrystalline base region (the implantation depth can be controlled by limiting the energy of ion implantation). Moreover, the polysilicon elevated extrinsic base region may also be doped through an in-situ doping process which completely avoids implantation damages. Therefore, such a device structure adopting the polysilicon elevated extrinsic base region is more advantageous in suppressing transient enhanced diffusion (TED) of the impurities, and can reduce as much as possible redistribution of the impurities doped in situ in the monocrystalline base region through an epitaxy process due to the postheat thermal budget thereof, thereby ensuring better performance of the device.

The base-region low-resistance metal silicide layer extending to the outside of the emitter-base spacer dielectric region and having a sufficiently small distance from the heavily doped monocrystalline emitter region has a very small sheet resistance, which is usually much smaller than a sheet resistance of the heavily doped monocrystalline or polycrystalline Si or SiGe. Therefore, as compared to the conventional self-aligned SiGe heterojunction bipolar transistor, a smaller base resistance $R_B$ can be obtained for the device of the present invention so that the noise and RF microwave power performance of the device can be further improved.

In addition to the base-region low-resistance metal silicide layer, the device structure adopting the polysilicon elevated extrinsic base region can also have an extrinsic-base-region low-resistance metal silicide layer formed on the surface of the polysilicon elevated extrinsic base region and an emitter-region low-resistance metal silicide layer formed on the surface of the polysilicon emitter region. This can not only further reduce the base resistance but also effectively reduce the emitter resistance so that the noise and RF microwave power performance of the device can be further improved.

The method of forming a metal silicide self-aligned SiGe heterojunction bipolar transistor of the present invention achieves the self-aligned device structure through a metal silicide process, so the need of complex steps necessary in the conventional process of forming a self-aligned SiGe heterojunction bipolar transistor is eliminated. Therefore, the process complexity and the manufacturing cost can be reduced effectively.

DETAILED DESCRIPTION OF THE INVENTION

Hereinbelow, the present invention will be described in detail with reference to the attached drawings and preferred embodiments thereof.

A metal silicide self-aligned SiGe heterojunction bipolar transistor of the present invention mainly comprises Si collector region, local dielectric region, base region, base-region low-resistance metal silicide layer, polysilicon emitter region, emitter-base spacer dielectric region, monocrystalline emitter region beneath emitter window enclosed by the emitter-base spacer dielectric region, contact hole dielectric layer, emitter metal electrode and base metal electrode. The emitter-base spacer dielectric region is composed of a liner silicon oxide layer and a silicon nitride inner sidewall, and the base-region low-resistance metal silicide layer extends all the way to the outside of the emitter-base spacer dielectric region.

The metal silicide self-aligned SiGe heterojunction bipolar transistor of the present invention mainly has four forms of structures. First, the base region comprises monocrystalline base region, heavily doped monocrystalline base region and polycrystalline base region, the base region is located above the Si collector region and the local dielectric region, the polysilicon emitter region and the emitter-base spacer dielectric region are located above the monocrystalline base region, and the base-region low-resistance metal silicide layer is located on the surface of the base region. Second, as compared to the first structure, the transistor further comprises polysilicon-emitter-region low-resistance metal silicide layer that is located on the surface of the polysilicon emitter region. Third, the base region comprises monocrystalline base region, polycrystalline base region and polysilicon elevated extrinsic base region, the monocrystalline base region and the polycrystalline base region are located above the Si collector region and the local dielectric region, the base-region low-resistance metal silicide layer is located on surfaces of the polycrystalline base region and a portion of the monocrystalline base region, the polysilicon emitter region and the emitter-base spacer dielectric region are located above the monocrystalline base region, and the polysilicon elevated extrinsic base region is located above the base-region low-resistance metal silicide layer. Fourth, as compared to the third structure, the transistor further comprises emitter-region low-resistance metal silicide layer that is located on the surface of the polysilicon emitter region and extrinsic-base-region low-resistance metal silicide layer that is located on the surface of the polysilicon elevated extrinsic base region.

To achieve the four forms of structures, the method of forming a metal silicide self-aligned SiGe heterojunction bipolar transistor of the present invention also comprises four kinds of process flows.

Figure 1:
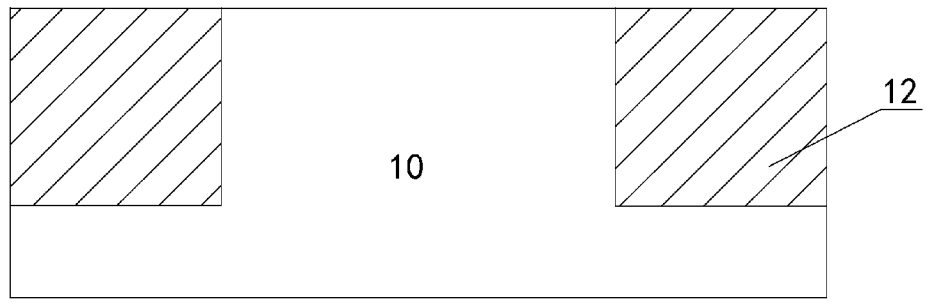
FIG. 1 to FIG. 13 are schematic views of a process flow according to a first preferred embodiment of the present invention.

Structure I: as shown in FIG. 1, a Si epitaxial layer of the first conduction type is formed on a semiconductor substrate (not shown). In order to reduce capacitance $C_{BC}$ between the base region and the collector region, a local dielectric region 12 may be formed in a portion of the Si epitaxial layer by etching shallow trench in the Si epitaxial layer and then filling with dielectric material therein or through local oxidization. The local dielectric region 12 is generally made of silicon oxide, but is not limited thereto. A remaining portion of the Si epitaxial layer of the first conduction type after the local dielectric region 12 is formed forms the Si collector region 10.

Figure 2:
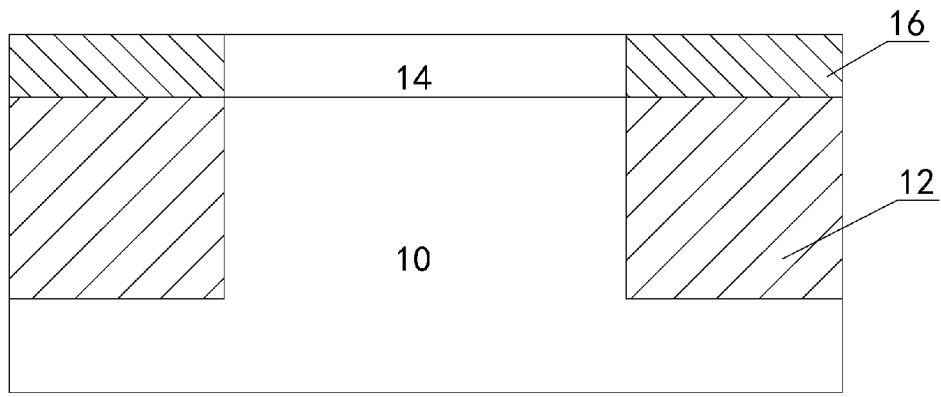

As shown in FIG. 2, the base region of a second conduction type is formed through an in-situ doped epitaxy growth. That is, a monocrystalline base region 14 of the second conduction type (which is generally an epitaxial multilayer comprising Si and SiGe) is obtained on top of the Si collector region 10, and a polycrystalline base region 16 of the second conduction type (which is generally a polycrystalline multilayer comprising Si and SiGe) is obtained on top of the local dielectric region 12.

Figure 3:
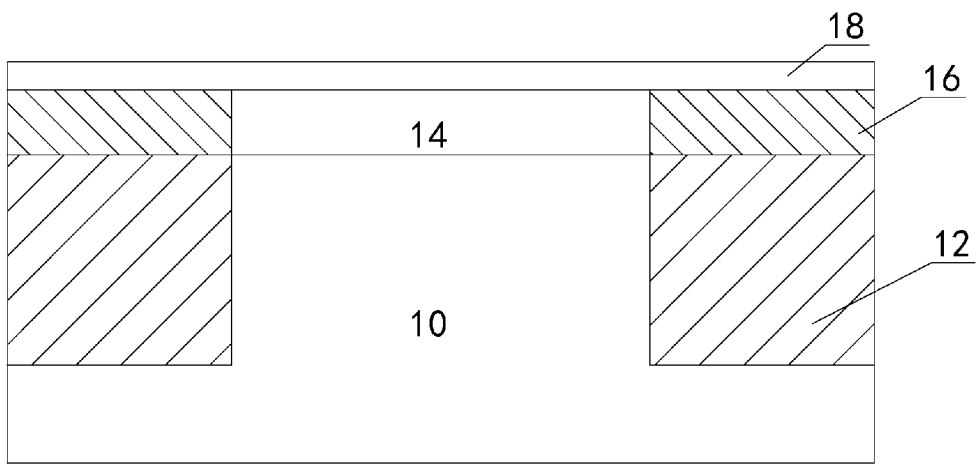

As shown in FIG. 3, a first metal layer 18 is deposited or sputtered. The metal layer may be but is not limited to Ti, Co or Ni, and the first metal layer 18 has a thickness ranging between 5 nm and 500 nm.

Figure 4:
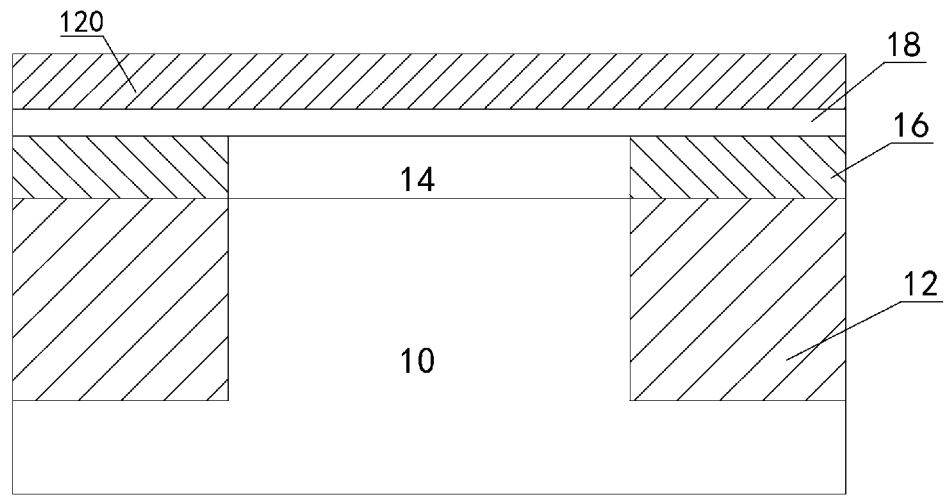

As shown in FIG. 4, a first silicon oxide layer 120 is deposited.

Figure 5:
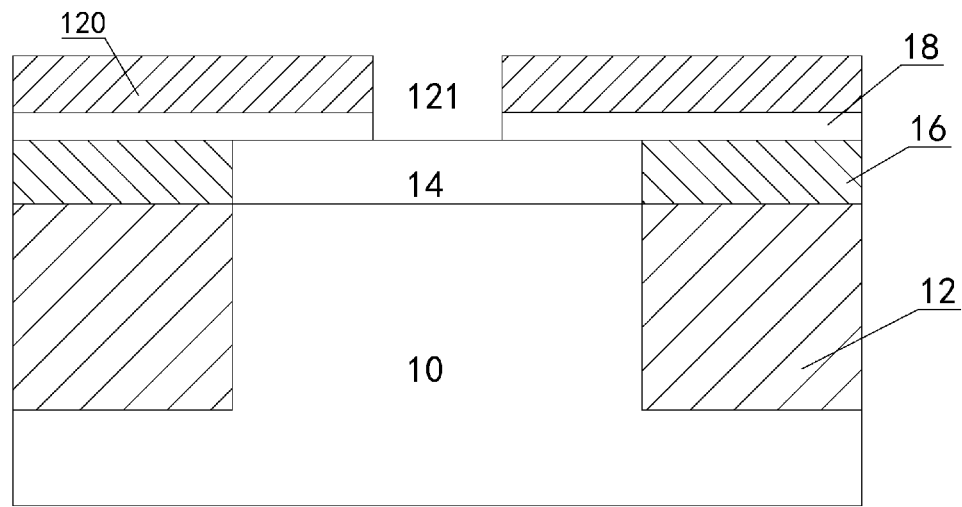

As shown in FIG. 5, middle portions of the first silicon oxide layer 120 and the first metal layer 18 are selectively removed in sequence through photolithography to form a first window 121 which exposes the middle portion of the under monocrystalline base region 14.

Figure 6:
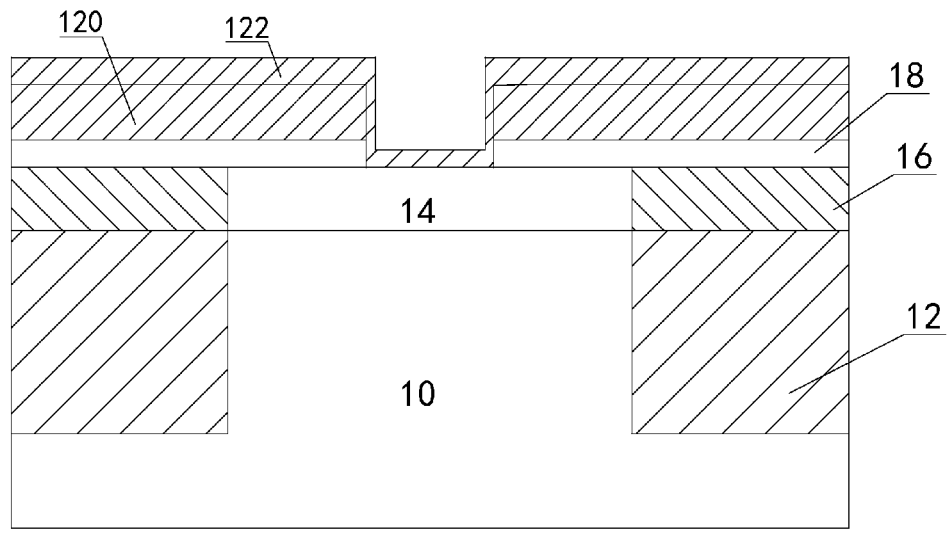

As shown in FIG. 6, a second silicon oxide layer 122 with a thickness ranging between 5 nm and 50 nm is deposited.

Figure 7:
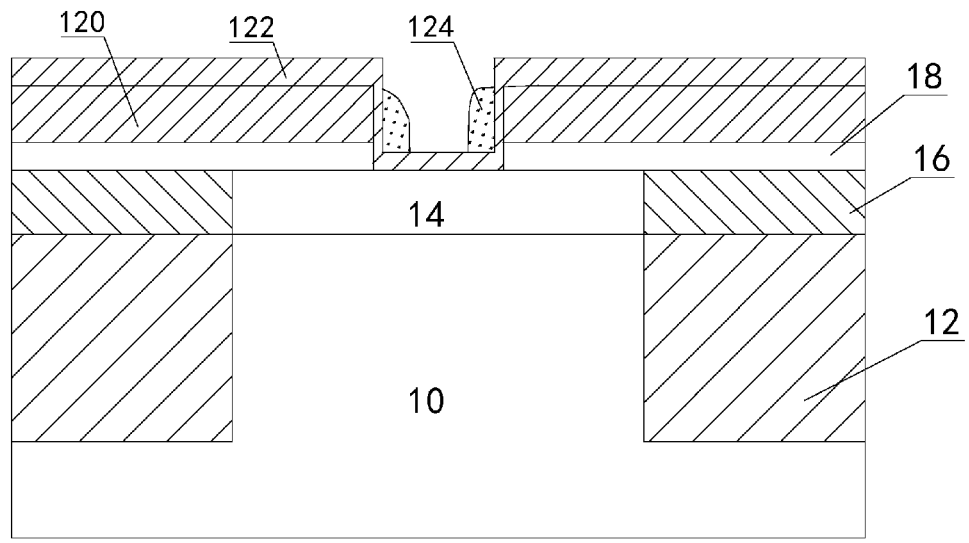

As shown in FIG. 7, a silicon nitride inner sidewall 124 is formed at the edge of the first window 121 by depositing a silicon nitride layer firstly and then carrying out an anisotropic etching process on the silicon nitride layer. The silicon nitride inner sidewall 124 has a width ranging between 10 nm and 500 nm.

Figure 8:
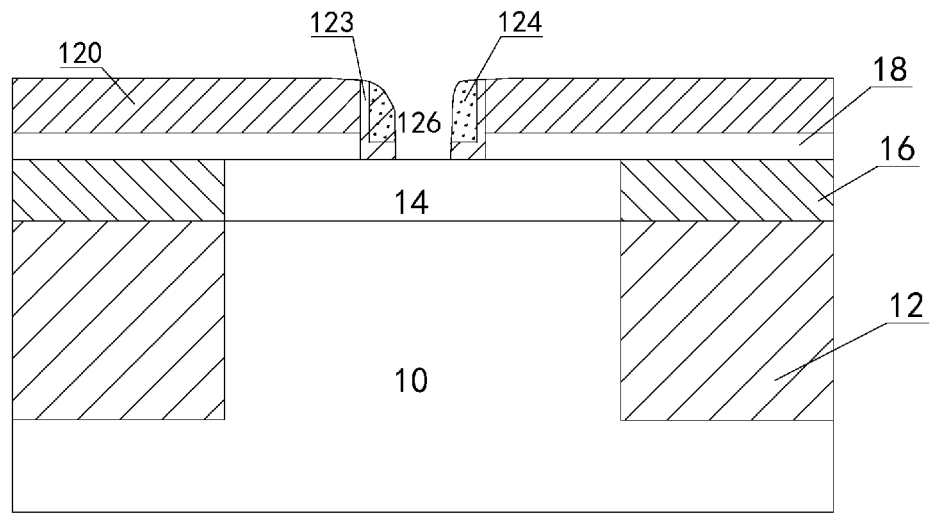

As shown in FIG. 8, by using the silicon nitride inner sidewall 124 as a mask, portions of the second silicon oxide layer 122 which are not covered by the silicon nitride inner sidewall 124 are removed through a wet etching process to form the emitter-base spacer dielectric region composed of the liner silicon oxide layer 123 and the silicon nitride inner sidewall 124. An emitter window 126 enclosed by the emitter-base spacer dielectric region is opened to expose the middle portion of the monocrystalline SiGe base region 14 again.

Figure 9:
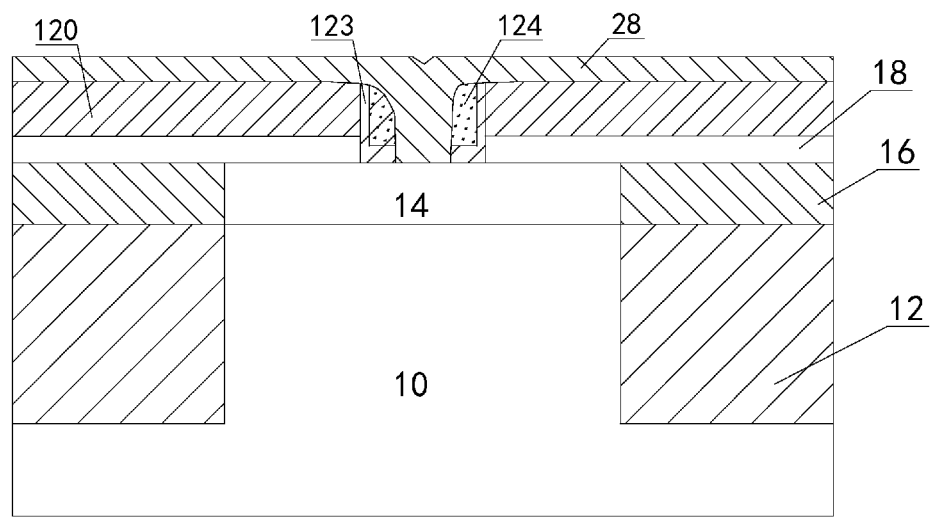

As shown in FIG. 9, a polysilicon layer 28 is deposited and then heavily doped into a polysilicon layer of the first conduction type by using an ion implantation process at a dosage greater than $10^{14}/cm^2$ after deposition or by using an in-situ doping process during deposition.

Figure 10:
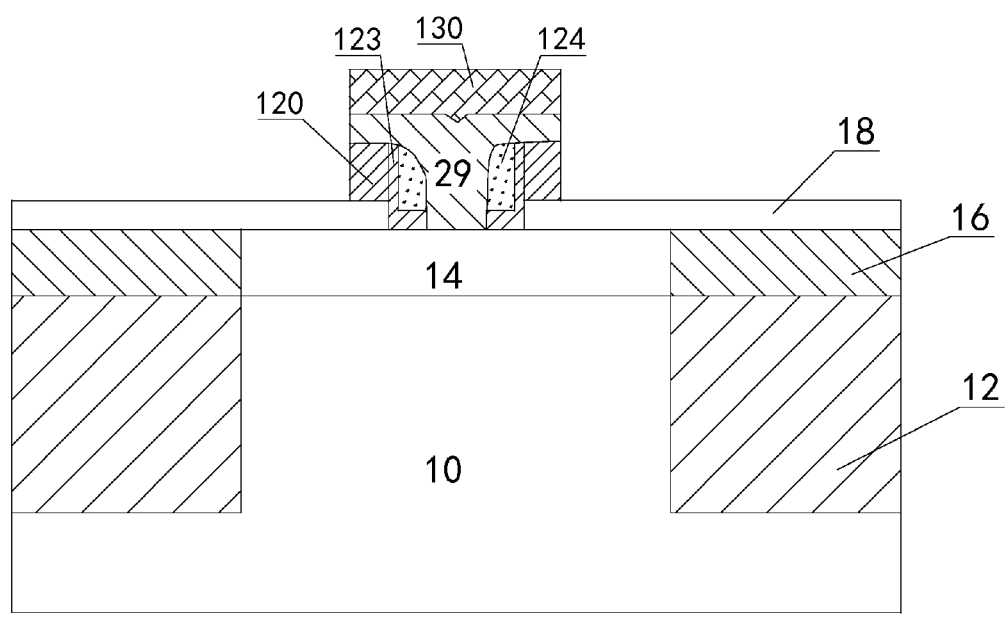

As shown in FIG. 10, a protection layer 130 is formed on the polysilicon layer 28 through photolithography; and then, by using the protection layer 130 as a mask, unmasked portions of the polysilicon layer 28 and the first silicon oxide layer 120 are etched off in sequence to form the heavily doped polysilicon emitter region 29 of the first conduction type. After the etching, the protection layer 130 is still retained. The protection layer and the heavily doped polysilicon emitter region of the first conduction type that is formed through etching by using the protection layer as a mask cover each side of the first window at a size no less than the minimum overlay size permitted by photolithography.

Figure 11:
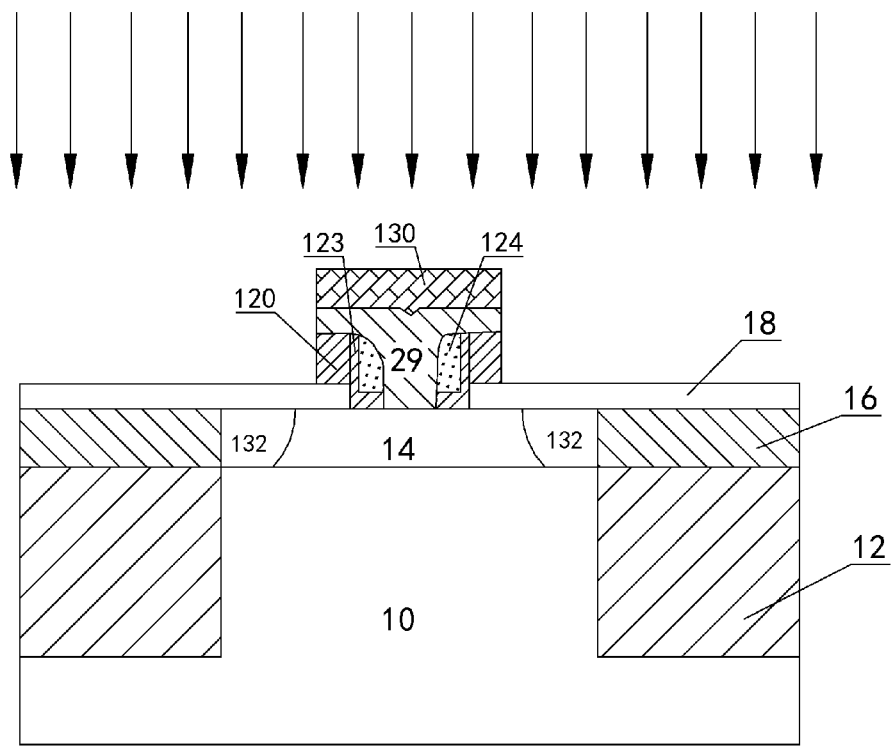

As shown in FIG. 11, by continuing using the protection layer 130 as a mask, ions (which may be, for example, but is not limited to boron (B) ions or boron difluoride ($BF_2$) ions) of the second conduction type are implanted at a dosage greater than $10^{14}/cm^2$ to form a heavily doped monocrystalline base region 132 of the second conduction type, and the polycrystalline SiGe base region 16 of the second conduction type is also heavily doped at the same time. Then, the protection layer 130 is removed. The protection layer is preferably made of a photoresist.

Figure 12:
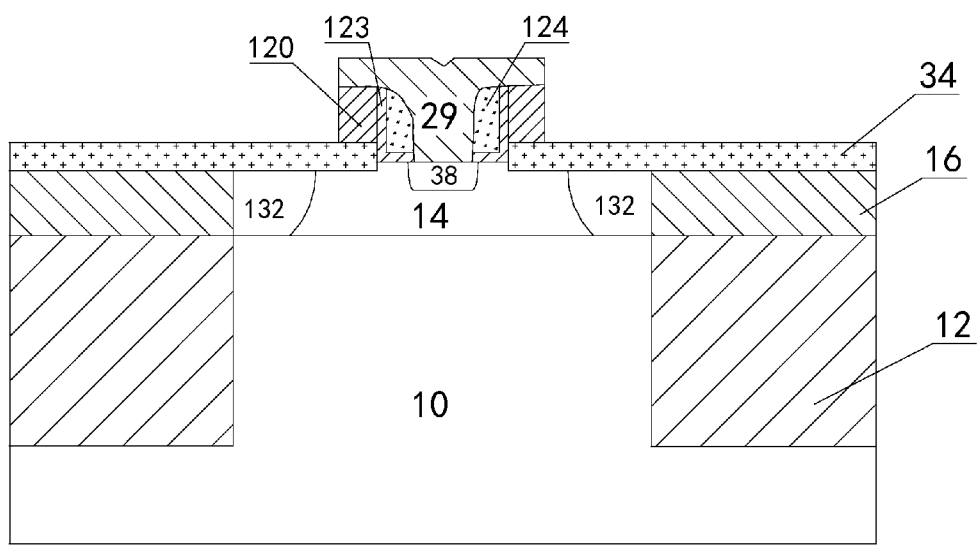

As shown in FIG. 12, by using one step or more steps of rapid thermal annealing process, the metal layer 18 is enabled to make a silicification reaction with a portion of the monocrystalline base region 14, the heavily doped monocrystalline base region 132 and the heavily doped polycrystalline base region 16, which are beneath and in contact with the metal layer 18, respectively to form the base-region low-resistance metal silicide layer 34. The base-region low-resistance metal silicide layer 34 may be but is not limited to titanium silicide, cobalt silicide or nickel silicide.

At the same time or before or after the aforesaid metal silicide process, by using a thermal annealing process or a thermal diffusion drive-in process, the impurities in the heavily doped polysilicon emitter region 29 of the first conduction type is diffused outwards and downwards via the emitter window 126 to form a heavily doped monocrystalline emitter region 38 of the first conduction type.

Figure 13:
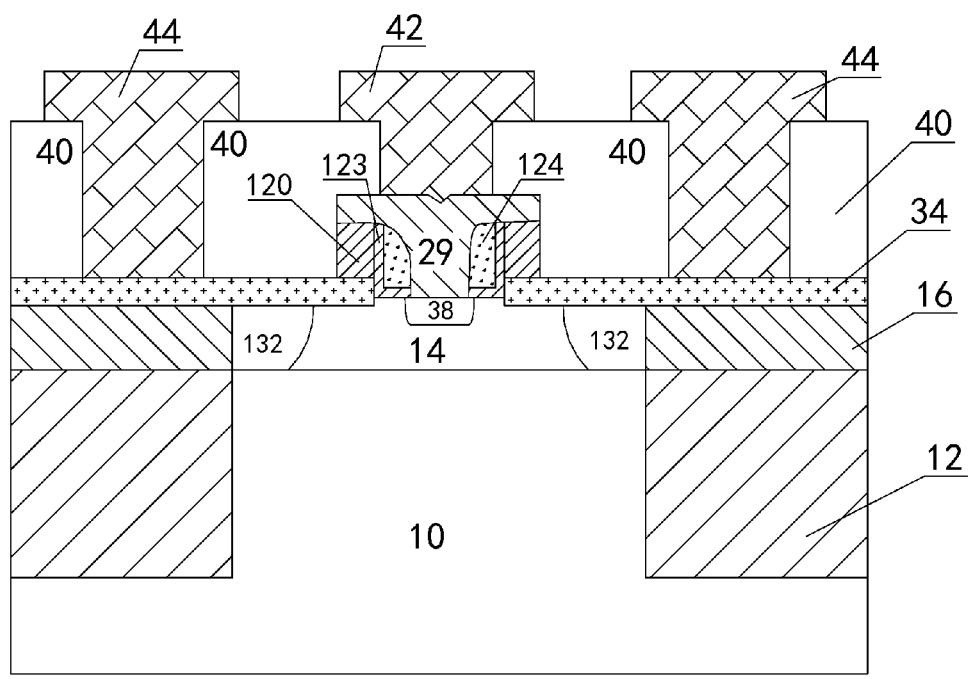

As shown in FIG. 13, back-end processes of a conventional semiconductor device and IC thereof including dielectric layer deposition, contact hole photolithography and etching, metal layer sputtering, photolithography and etching and so on may be used to complete the process flow of the device fabrication. The reference number 40 represents the contact hole dielectric layer, and the reference numbers 42 and 44 represent the emitter metal electrode and the base metal electrode, respectively.

Because the present invention has no limitation on the leading-out manner of the collector, the leading-out electrode of the collector region is not shown in the attached drawings of the process flow of the above implementation. In practice, if the substrate (not shown) is a heavily doped Si wafer of the first conduction type, then the collector can be led out from the back surface of the heavily doped substrate; and if the substrate is a Si wafer of the second conduction type, then the collector can be led out through a conventional process such as from a heavily doped buried layer of the first conduction type (formed on the substrate of the second conduction type), on top of which the Si epitaxial layer and then the Si collector region 10 of the first conduction type are formed, via heavily doped collector Sinker to the collector metal electrode on the front surface of the wafer.

Preferred embodiment I: as shown in FIG. 1 to FIG. 13, a local dielectric region 12 is formed by etching shallow trench in the Si epitaxial layer grown on the semiconductor substrate (not shown) and then filling with silicon oxide therein, and a portion of the Si epitaxial layer in which the local dielectric region is not formed forms the Si collector region 10. The local dielectric region 12 is made of silicon oxide. The monocrystalline base region 14 of the second conduction type which is made of a multilayer epitaxial material comprising Si and SiGe is formed on the Si collector region 10, and the polycrystalline SiGe base region 16 of the second conduction type which is made of a multilayer polycrystalline material comprising Si and SiGe is formed on the local dielectric region 12.

A Ti layer 18 is sputtered, and a first silicon oxide layer 120 is deposited. Middle portions of the first silicon oxide layer 120 and the metal layer 18 are selectively removed in sequence through photolithography, opening a first window 121 and exposing the middle portion of the under monocrystalline base region. A second silicon oxide layer 122 with a thickness of 10 nm is deposited. A silicon nitride inner sidewall 124 with a width of 100 nm is formed at the edge of the first window 121 by depositing a silicon nitride layer firstly and then carrying out an anisotropic etching process on the silicon nitride layer.

By using the silicon nitride inner sidewall 124 as a mask, portions of the second silicon oxide layer 122 which are not covered by the silicon nitride inner sidewall 124 are removed through a wet etching process to open an emitter window which exposes the middle portion of the monocrystalline base region 14 again. A polysilicon layer is deposited and then heavily doped into a polysilicon layer of the first conduction type by using an ion implantation process at a dosage of $10^{15}/cm^2$ after deposition. A photoresist is formed as a protection layer 130 on the polysilicon layer through photolithography; and then, by using the photoresist as a mask, a portion of the polysilicon layer and a portion of the first silicon oxide layer are etched off in sequence to form a heavily doped polysilicon emitter region 29 of the first conduction type. After the etching, the photoresist is still retained.

By continuing using the photoresist as a mask, $BF_2$ ions are implanted at a dosage of $3 \times 10^{15}/cm^2$ to form a heavily doped monocrystalline base region 132 of the second conduction type and a heavily doped polycrystalline base region of the second conduction type. Then, the photoresist is removed.

By using two steps of rapid thermal annealing process, the metal layer is enabled to make a silicification reaction with a portion of the monocrystalline base region 14, the heavily doped monocrystalline base region 132 and the heavily doped polycrystalline base region 16, which are beneath and in contact with the metal layer, respectively to form the base region low-resistance metal silicide layer 34. At the same time, by using the thermal annealing process, the impurities in the heavily doped polysilicon emitter region of the first conduction type is diffused outwards and downwards via the emitter window to form the heavily doped monocrystalline emitter region 38 of the first conduction type. Dielectric layer 40 is deposited and then etched through photolithography to form contact holes; and metal layer is sputtered and then etched through photolithography to form the emitter metal electrode 42 and the base metal electrode 44. Finally, the process flow of forming the device is completed.

Figure 14:
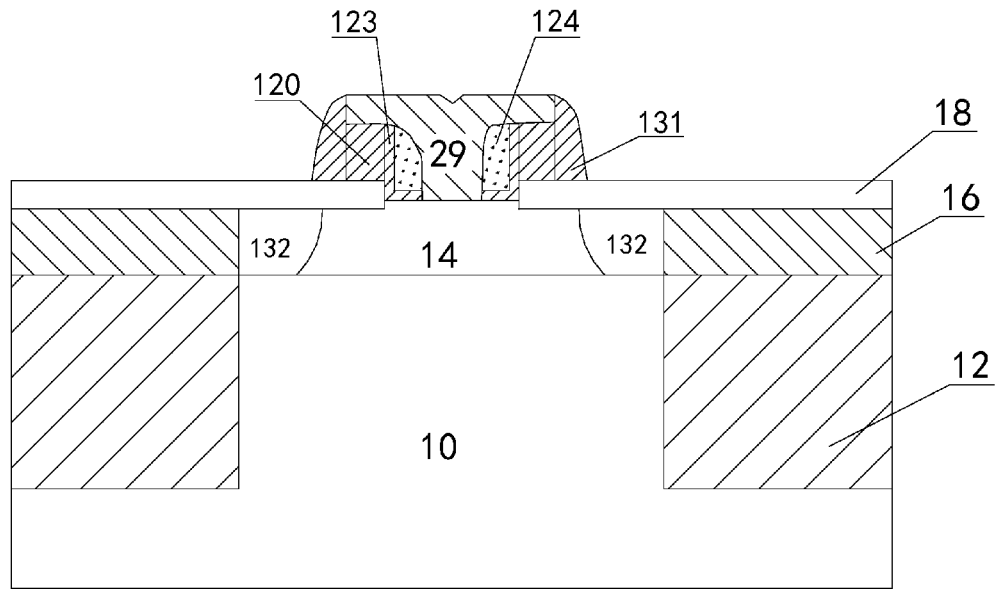
FIG. 14 to FIG. 17 are schematic views of a process flow according to a second preferred embodiment of the present invention.

Structure II: the first eleven steps are the same as the first to the eleventh steps of the structure I, as shown in FIG. 1 to FIG. 11. As shown in FIG. 14, a silicon oxide outer sidewall 131 is formed by depositing a silicon oxide layer firstly and then carrying out an anisotropic etching process on the silicon oxide layer.

Figure 15:
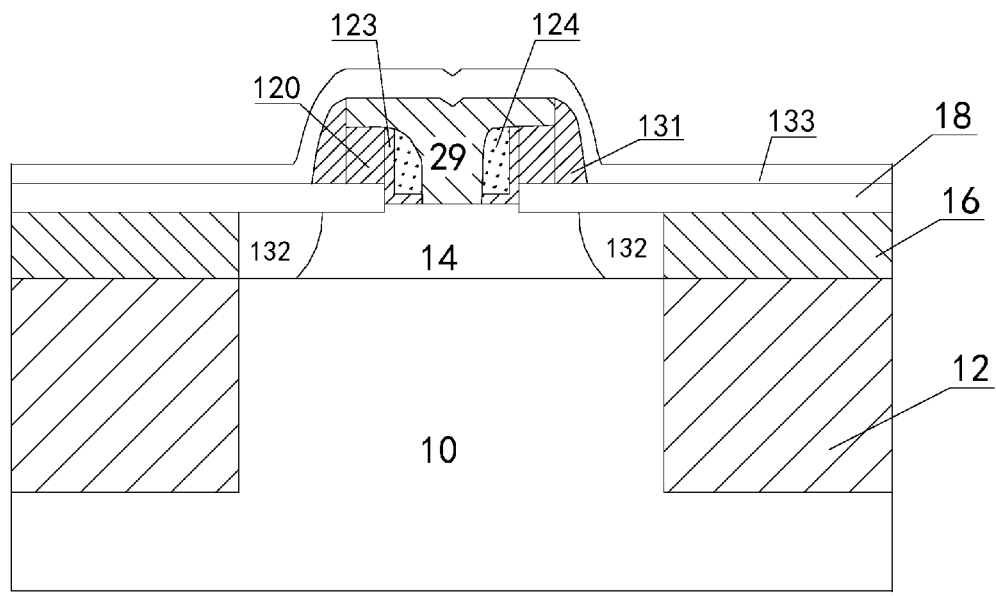

As shown in FIG. 15, a second metal layer 133 is deposited or sputtered. The metal may be but is not limited to Ti, Co or Ni.

Figure 16:
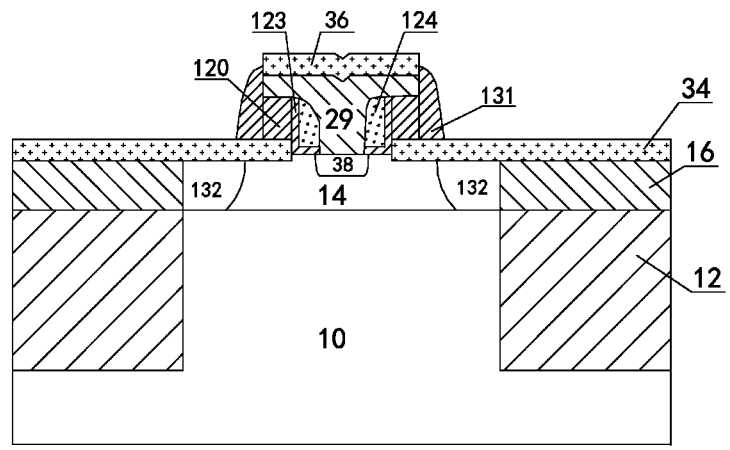

As shown in FIG. 16, by using one step or more steps of rapid thermal annealing process, the first metal layer 18 is enabled to make a silicification reaction with a portion of the monocrystalline base region 14, the heavily doped monocrystalline base region 132 and the heavily doped polycrystalline base region 16, which are beneath and in contact with the first metal layer 18, respectively to form a base-region low-resistance metal silicide layer 34; and meanwhile, the second metal layer 133 is enabled to make a silicification reaction with the under polysilicon emitter region 29 to form a polysilicon-emitter-region low-resistance metal silicide layer 36. Both the base-region low-resistance metal silicide layer 34 and the polysilicon-emitter-region low-resistance metal silicide layer 36 may be but are not limited to titanium silicide, cobalt silicide or nickel silicide. Then, because no silicification reaction occurs between the metal layer 133 and the silicon oxide outer sidewall 131, portions of the second metal layer which have not made the silicification reaction are removed through a wet etching process.

At the same time as or before or after the aforesaid metal silicide process, by using thermal annealing process or thermal diffusion drive-in process, the impurities in the heavily doped polysilicon emitter region 29 of the first conduction type is diffused outwards and downwards via the emitter window 126 to form a heavily doped monocrystalline emitter region 38 of the first conduction type.

Figure 17:
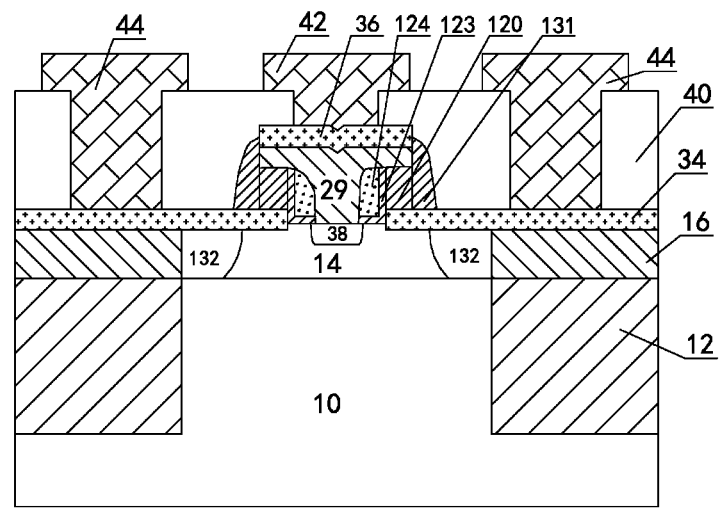

As shown in FIG. 17, back-end processes of a conventional semiconductor device and an IC thereof including dielectric layer deposition, contact hole photolithography and etching, metal sputtering, photolithography and etching and so on may be used to complete the process flow of forming the device. The reference number 40 represents the contact hole dielectric layer, and the reference numbers 42 and 44 represent the emitter metal electrode and the base metal electrode, respectively.

Because the present invention has no limitation on the leading-out manner of the collector, the leading-out electrode of the collector region is not shown in the attached drawings of the process flow of the above implementation. In practice, if the substrate (not shown) is a heavily doped Si wafer of the first conduction type, then the collector can be led out from the back surface of the heavily doped substrate; and if the substrate is a Si wafer of the second conduction type, then the collector can be led out through a conventional process such as from a heavily doped buried layer of the first conduction type (formed on the substrate of the second conduction type), on top of which the Si epitaxial layer and then the Si collector region 10 of the first conduction type are formed, via heavily doped collector Sinker to the collector metal electrode on the front surface of the wafer.

Preferred embodiment II: as shown in FIG. 1 to FIG. 11 and FIG. 14 to FIG. 17, the local dielectric region 12 is formed by etching shallow trench in the Si epitaxial layer grown on a semiconductor substrate (not shown) and then filling with dielectric material therein, and a portion of the Si epitaxial layer in which the local dielectric region is not formed forms the Si collector region 10. The local dielectric region 12 is made of silicon oxide. A monocrystalline base region 14 of the second conduction type which is made of a epitaxial multilayer comprising Si and SiGe is formed on top of the Si collector region, and a polycrystalline base region 16 of the second conduction type which is made of a polycrystalline multilayer comprising Si and SiGe is formed on top of the local dielectric region 12.

A first Ti layer 18 is sputtered, and a first silicon oxide layer 120 is deposited. Middle portions of the first silicon oxide layer 120 and the first Ti layer 18 are selectively removed in sequence through photolithography to form the first window 121 which exposes the middle portion of the under monocrystalline base region 14. A second silicon oxide layer 122 with a thickness of 10 nm is deposited. A silicon nitride inner sidewall 124 with a width of 100 nm is formed at the edge of the first window 121 by depositing a silicon nitride layer firstly and then carrying out an anisotropic etching process on the silicon nitride layer.

By using the silicon nitride inner sidewall 124 as a mask, portions of the second silicon oxide layer 122 which are not covered by the silicon nitride inner sidewall 124 are removed through a wet etching process to open the emitter window 126 which exposes the middle portion of the monocrystalline base region 14 again. A polysilicon layer 28 is deposited and then heavily doped into the polysilicon layer of the first conduction type by using an ion implantation process at a dosage of $5 \times 10^{15}/cm^2$ after deposition. A photoresist 130 is formed as a protection layer on the polysilicon layer through photolithography; and then, by using the photoresist as a mask, a portion of the polysilicon layer and a portion of the first silicon oxide layer which are not masked by the photoresist 130 are etched off in sequence to form the heavily doped polysilicon emitter region 29 of the first conduction type. After the etching, the photoresist is still retained.

By continuing using the photoresist as a mask, $BF_2$ ions are implanted at a dosage of $3 \times 10^{15}/cm^2$ to form the heavily doped monocrystalline base region 132 of the second conduction type and the heavily doped polycrystalline base region of the second conduction type. Then, the photoresist is removed. A silicon oxide outer sidewall 131 is formed by depositing a silicon oxide layer firstly and then carrying out an anisotropic etching process on the silicon oxide layer. A second Ti layer 133 is sputtered.

By using a first step of rapid thermal annealing process, the first Ti layer 18 is enabled to make a silicification reaction with a portion of the monocrystalline base region 14, the heavily doped monocrystalline base region 132 and the heavily doped polycrystalline base region 16, which are beneath and in contact with the first Ti layer 18, respectively, to form the base-region Ti silicide layer; and the second Ti layer 133 is enabled to make a silicification reaction with the under polysilicon emitter region 29 to form a polysilicon-emitter-region Ti silicide layer. Portions of the second Ti layer which have not made the silicification reaction are removed through a wet etching process. Then, by using the second step of rapid thermal annealing process, the base-region Ti silicide layer and the polysilicon-emitter-region Ti silicide layer are converted into the base-region low-resistance Ti silicide layer 34 and the polysilicon-emitter-region low-resistance Ti silicide layer 36, respectively.

At the same time, by using the thermal annealing process, the impurities in the heavily doped polysilicon emitter region of the first conduction type is diffused outwards and downwards via the emitter window to form the heavily doped monocrystalline emitter region 38 of the first conduction type. The dielectric layer 40 is deposited and then etched through photolithography to form contact holes; and metal layer is sputtered and then etched through photolithography to form the emitter metal electrode 42 and the base metal electrode 44. Finally, the process flow of forming the device is completed.

Figure 18:
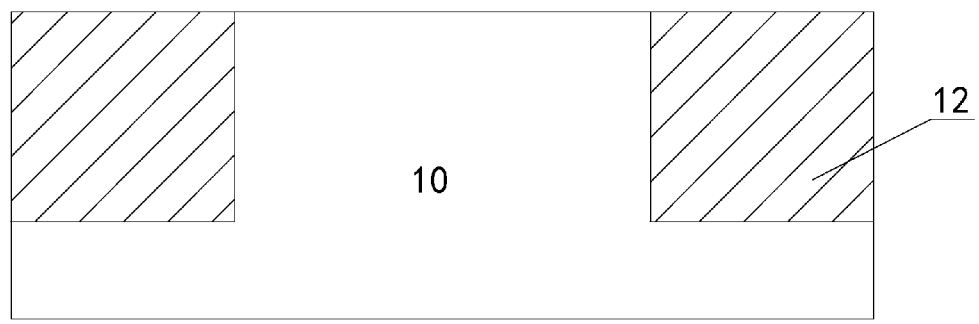
FIG. 18 to FIG. 29 are schematic views of a process flow according to a third preferred embodiment of the present invention.

Structure III: as shown in FIG. 18, a Si epitaxial layer of a first conduction type is formed on a semiconductor substrate (not shown). In order to reduce capacitance $C_{BC}$ between the base region and the collector region, the local dielectric region 12 may be formed in a portion of the Si epitaxial layer by etching shallow trench in the Si epitaxial layer and then filling with dielectric material therein or through local oxidization. The local dielectric region 12 is generally made of silicon oxide, but is not limited thereto. The remaining portion of the Si epitaxial layer of the first conduction type after the local dielectric region 12 is formed forms an Si collector region 10.

Figure 19:
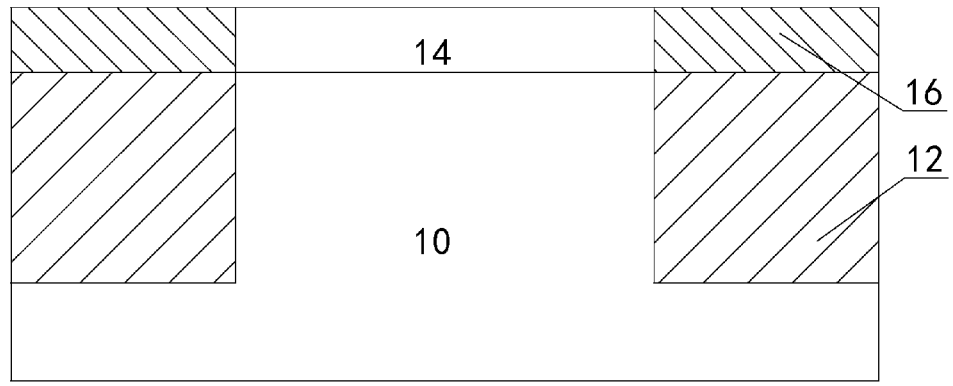

As shown in FIG. 19, the base region of a second conduction type is formed through an in-situ doped epitaxy process. That is, the monocrystalline base region 14 (which is generally a epitaxial multilayer comprising Si and SiGe) of the second conduction type is obtained on top of the Si collector region 10, and the polycrystalline base region 16 (which is generally a polycrystalline multilayer comprising Si and SiGe) of the second conduction type is obtained on top of the local dielectric region 12.

Figure 20:
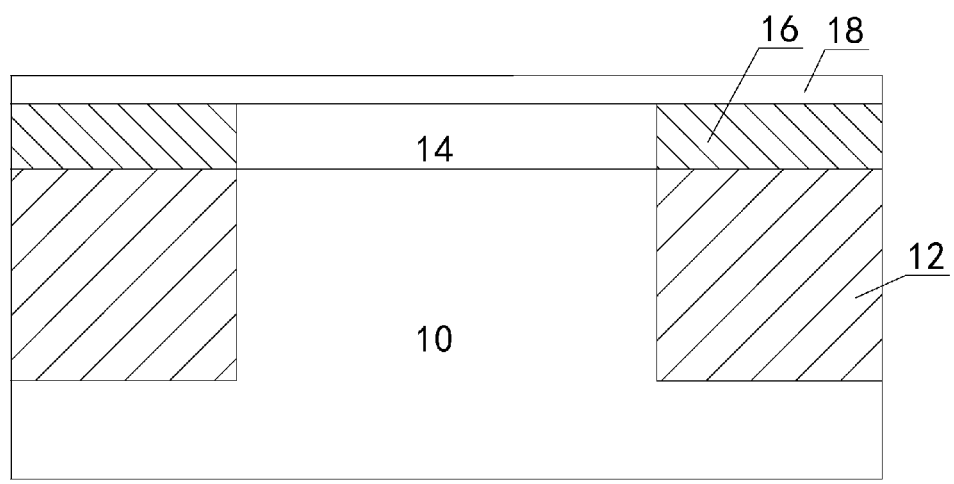

As shown in FIG. 20, a first metal layer 18 is deposited or sputtered. The metal may be but is not limited to Ti, Co or Ni, and the first metal layer 18 has a thickness ranging between 5 nm and 500 nm.

Figure 21:
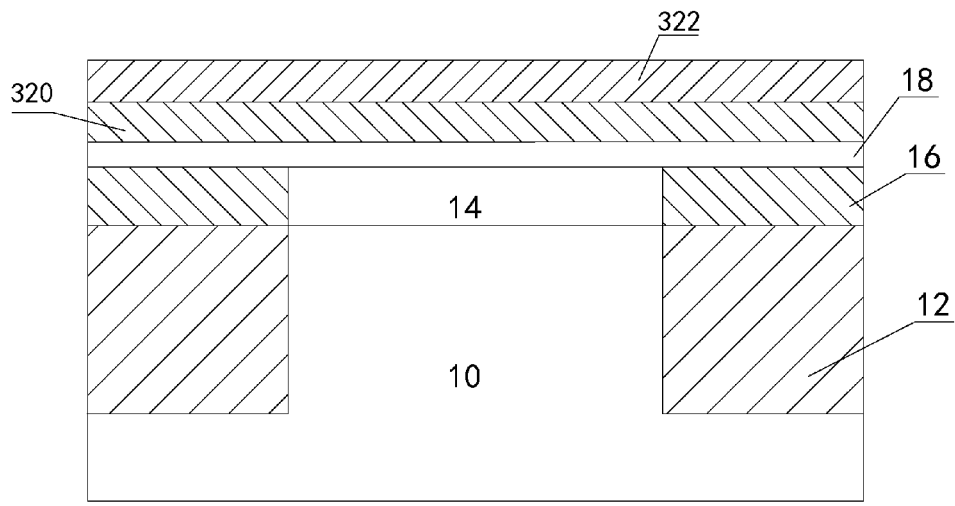

As shown in FIG. 21, a first polysilicon layer 320 is deposited and then heavily doped into a first polysilicon layer 320 of the second conduction type by using an ion implantation process at a dosage greater than $10^{14}/cm^2$ after deposition or by using an in-situ doping process during deposition; and a first silicon oxide layer 322 is deposited on the first polysilicon layer 320.

Figure 22:
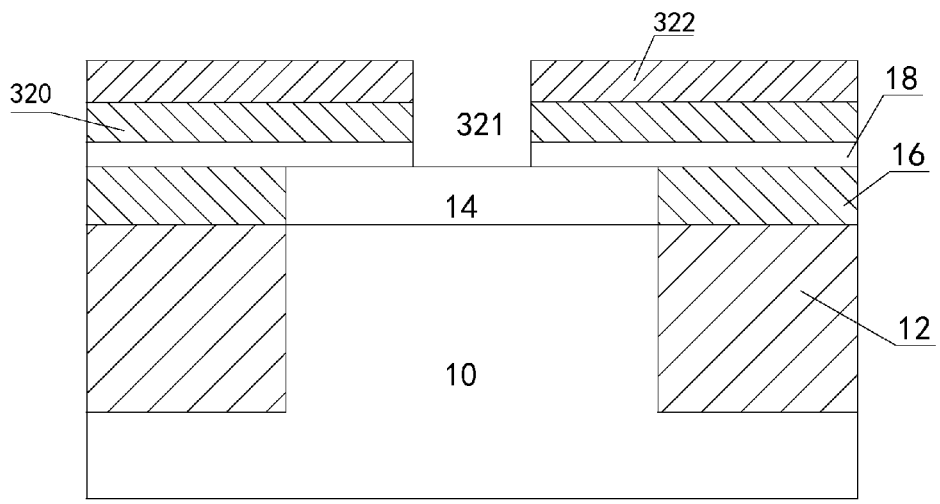

As shown in FIG. 22, middle portions of the first silicon oxide layer 322, the first polysilicon layer 320 and the first metal layer 18 are selectively removed in sequence through photolithography to form a first window 321 which exposes the middle portion of the under monocrystalline base region 14. Remaining portions of the first polysilicon layer form the polysilicon elevated extrinsic base region.

Figure 23:
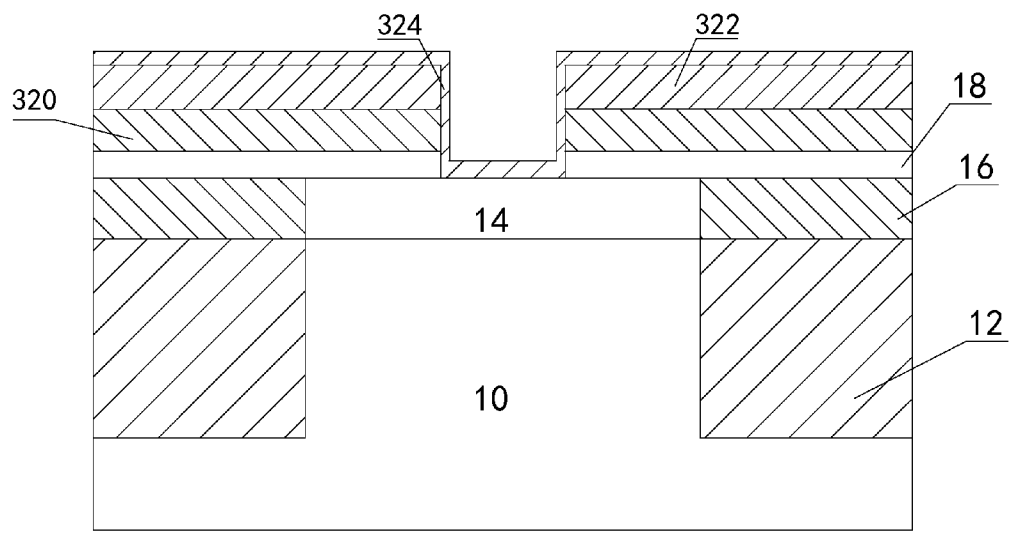

As shown in FIG. 23, a second silicon oxide layer 324 with a thickness ranging between 5 nm and 50 nm is deposited.

Figure 24:
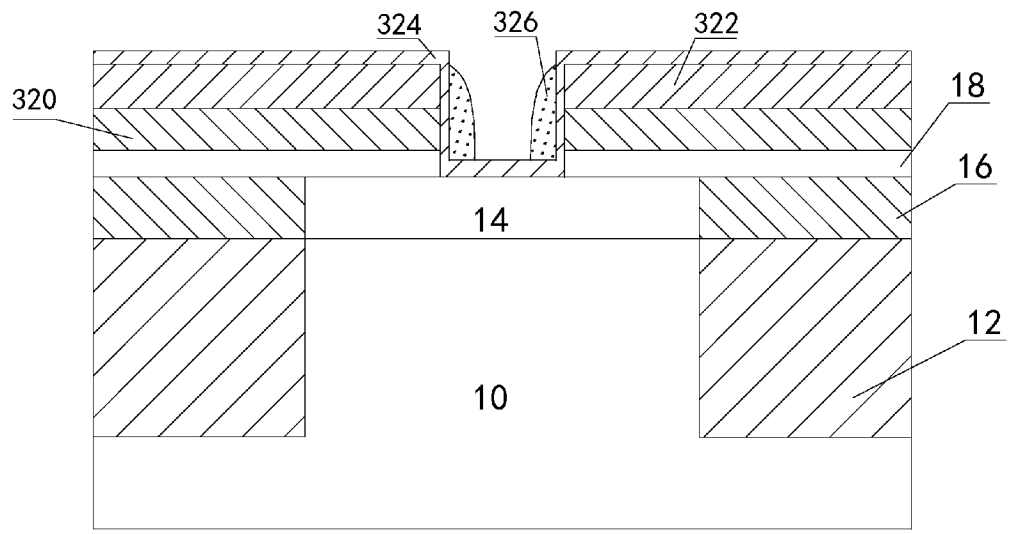

As shown in FIG. 24, a silicon nitride inner sidewall 326 is formed at the edge of the first window 321 by depositing a silicon nitride layer firstly and then carrying out an anisotropic etching process on the silicon nitride layer. The silicon nitride inner sidewall 326 has a width ranging between 10 nm and 500 nm.

Figure 25:
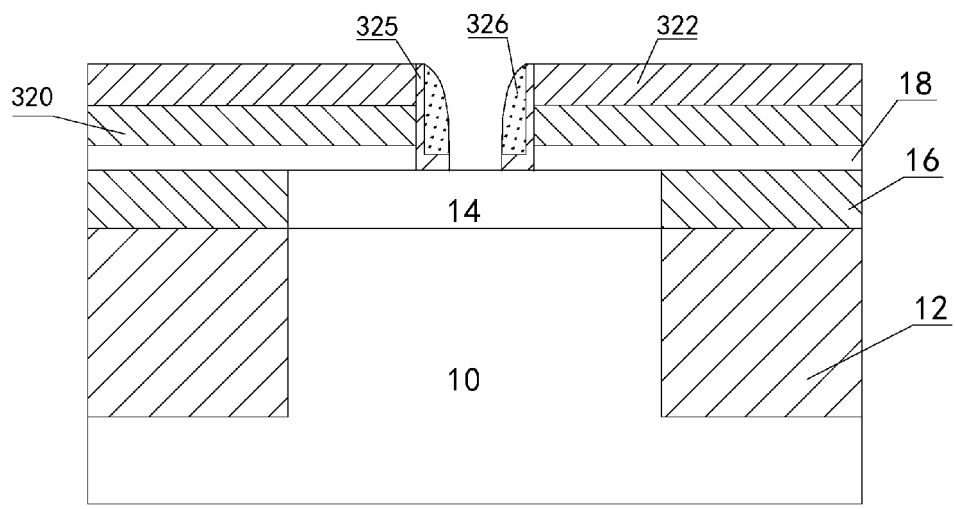

As shown in FIG. 25, by using the silicon nitride inner sidewall 326 as a mask, portions of the second silicon oxide layer 324 which are not covered by the silicon nitride inner sidewall 326 are removed through a wet etching process to form the liner silicon oxide layer 325 and the emitter-base spacer dielectric region composed of the liner silicon oxide layer 325 and the silicon nitride inner sidewall 326. An emitter window enclosed by the emitter-base spacer dielectric region is opened to expose the middle portion of the monocrystalline base region 14 again.

Figure 26:
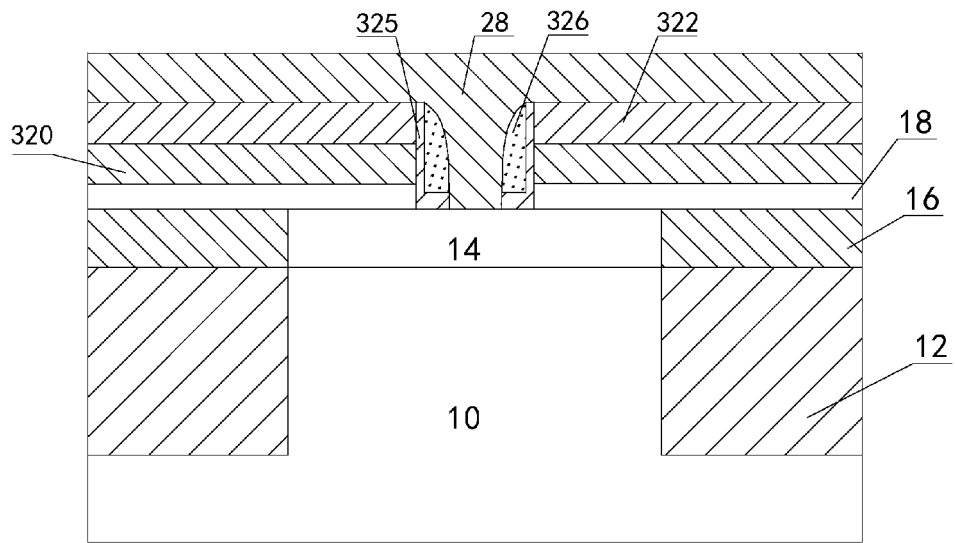

As shown in FIG. 26, a second polysilicon layer 28 is deposited and then heavily doped into a second polysilicon layer 28 of the first conduction type by using an ion implantation process at a dosage greater than $10^{14}/cm^2$ after deposition or by using an in-situ doping process during deposition.

Figure 27:
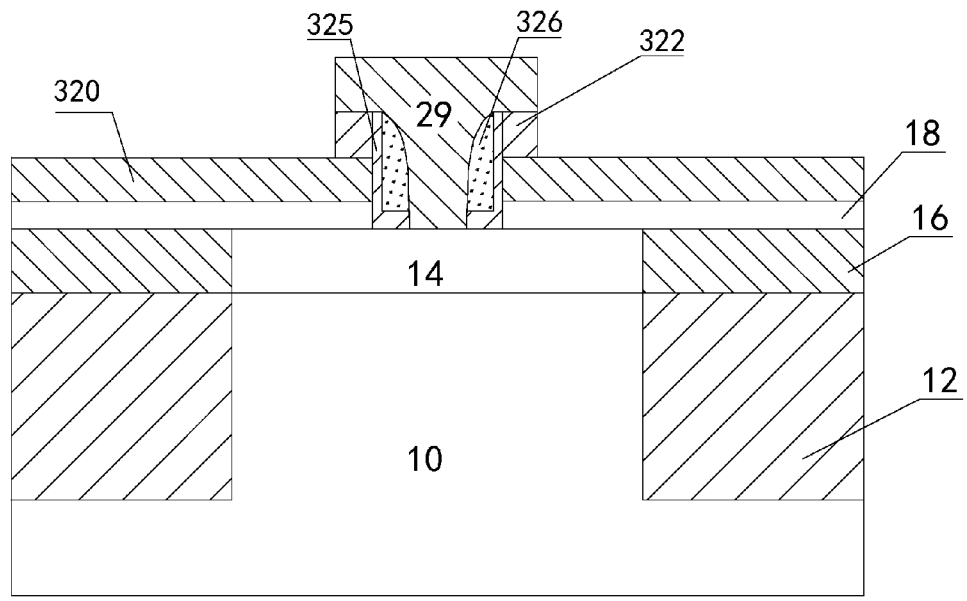

As shown in FIG. 27, portions of the polysilicon layer 28 and portions of the first silicon oxide layer 322 are etched off in sequence through photolithography to form the heavily doped polysilicon emitter region 29 of the first conduction type.

Figure 28:
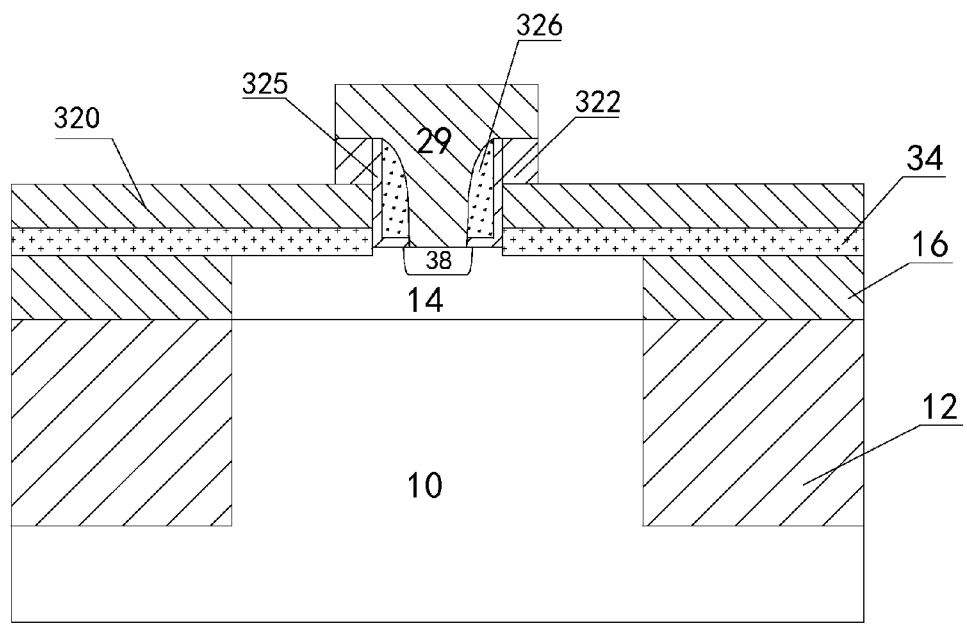

As shown in FIG. 28, by using one step or more steps of rapid thermal annealing process, the metal layer 18 is enabled to make a silicification reaction with a portion of the monocrystalline base region 14 and the polycrystalline base region 16 which are beneath and in contact with the metal layer 18 and the polysilicon elevated extrinsic base region 320 which is above and in contact with the metal layer 18, respectively, to form the base-region low-resistance metal silicide layer 34. The base-region low-resistance metal silicide layer 34 may be but is not limited to titanium silicide, cobalt silicide or nickel silicide.

At the same time as or before or after the aforesaid metal silicide process, by using thermal annealing process or thermal diffusion drive-in process, the impurities in the heavily doped polysilicon emitter region 29 of the first conduction type are diffused outwards and downwards via the emitter window to form the heavily doped monocrystalline emitter region 38 of the first conduction type.

Figure 29:
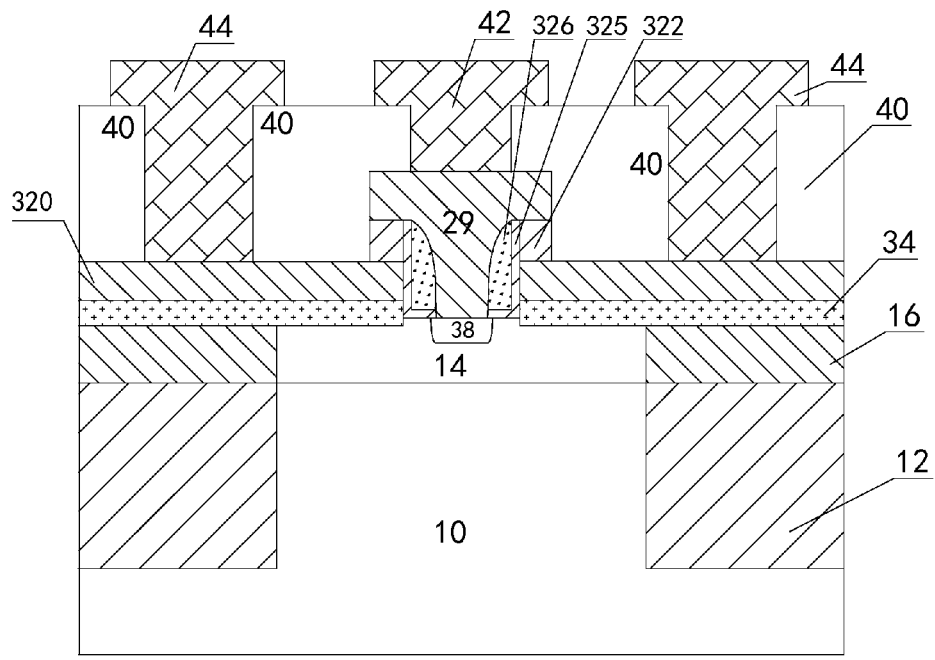

As shown in FIG. 29, back-end processes of a conventional semiconductor device and an IC thereof including contact hole dielectric layer deposition, contact hole photolithography and etching, metal layer sputtering, photolithography and etching and so on may be used to complete the process flow of forming the device. The reference number 40 represents the contact hole dielectric layer, and the reference numbers 42 and 44 represent the emitter metal electrode and the base metal electrode, respectively.

Because the present invention has no limitation on the leading-out manner of the collector, the leading-out electrode of the collector region is not shown in the attached drawings of the process flow of the above implementation. In practice, if the substrate (not shown) is a heavily doped Si wafer of the first conduction type, then the collector can be led out from the back surface of the heavily doped substrate; and if the substrate is a Si wafer of the second conduction type, then the collector can be led out through a conventional process such as from a heavily doped buried layer of the first conduction type (formed on the substrate of the second conduction type), on top of which the Si epitaxial layer and then the Si collector region 10 of the first conduction type are formed, via heavily doped collector Sinker to the collector metal electrode on the front surface of the wafer.

Preferred embodiment III: as shown in FIG. 18 to FIG. 29, the local dielectric region 12 is formed by etching shallow trench in an Si epitaxial layer grown on a semiconductor substrate (not shown) and then filling with a dielectric material therein, and a portion of the Si epitaxial layer in which the local dielectric region is not formed forms an Si collector region 10. The local dielectric region 12 is made of silicon oxide. The monocrystalline base region 14 of the second conduction type which is made of epitaxial multilayer comprising Si and SiGe is formed on top of the Si collector region 10, and the polycrystalline base region 16 of the second conduction type which is made of polycrystalline multilayer comprising Si and SiGe is formed on top of the local dielectric region 12.

A Ti layer 18 is sputtered; a heavily doped first polysilicon layer 320 of the second conduction type is obtained through deposition and an in-situ doping process; and a first silicon oxide layer 322 is deposited on the resulting structure. Middle portions of the first silicon oxide layer 322, the first polysilicon layer 320 and the metal layer 18 are selectively removed in sequence through photolithography to form the first window 321 which exposes the middle portion of the under monocrystalline base region 14. Remaining portions of the first polysilicon layer are called the polysilicon elevated extrinsic base region. A second silicon oxide layer 324 with a thickness of 10 nm is deposited. A silicon nitride inner sidewall 326 with a width of 100 nm is formed at the edge of the first window 321 by depositing a silicon nitride layer firstly and then carrying out an anisotropic etching process on the silicon nitride layer.

By using the silicon nitride inner sidewall 326 as a mask, portions of the second silicon oxide layer 324 which are not covered by the silicon nitride inner sidewall 326 are removed through a wet etching process to open the emitter window which exposes the middle portion of the monocrystalline base region 14 again. A second polysilicon layer 28 is deposited and then heavily doped into a second polysilicon layer 28 of the first conduction type by using an ion implantation process at a dosage of $5 \times 10^{15}/cm^2$ after deposition. Portions of the second polysilicon layer 28 and portions of the first silicon oxide layer 322 are etched off in sequence through photolithography to form the heavily doped polysilicon emitter region 29 of the first conduction type.

By using two steps of rapid thermal annealing process, the metal layer is enabled to make a silicification reaction with a portion of the monocrystalline base region 14 and the polycrystalline base region 16 which are beneath and in contact with the metal layer and the polysilicon elevated extrinsic base region 320 which is above and in contact with the metal layer, respectively, to form a low-resistance Ti silicide layer 34. At the same time, by using the thermal annealing process, the impurities in the heavily doped polysilicon emitter region 29 of the first conduction type are diffused outwards and downwards via the emitter window to form the heavily doped monocrystalline emitter region 38 of the first conduction type. The contact hole dielectric layer 40 is deposited and then etched through photolithography to form contact holes; and interconnection metal layer is sputtered and then etched through photolithography to form the emitter metal electrode 42 and the base metal electrode 44. Finally, the process flow of forming the device is completed.

Figure 30:
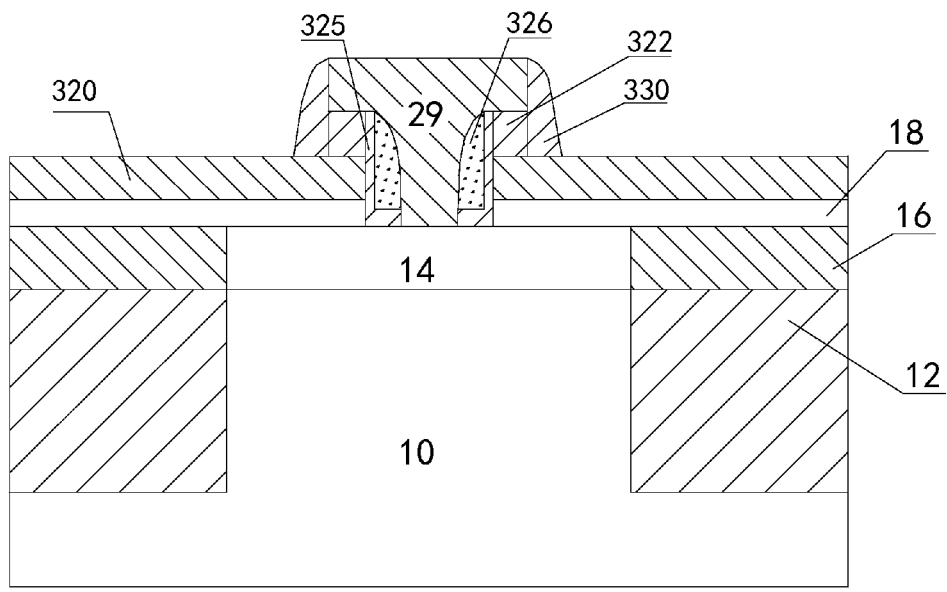
FIG. 30 to FIG. 33 are schematic views of a process flow according to a fourth preferred embodiment of the present invention.

Structure IV: the first ten steps are the same as the first ten steps of the structure III, as shown in FIG. 18 to FIG. 27. As shown in FIG. 30, a silicon oxide outer sidewall 330 is formed by depositing a silicon oxide layer firstly and then carrying out an anisotropic etching process on the silicon oxide layer.

Figure 31:
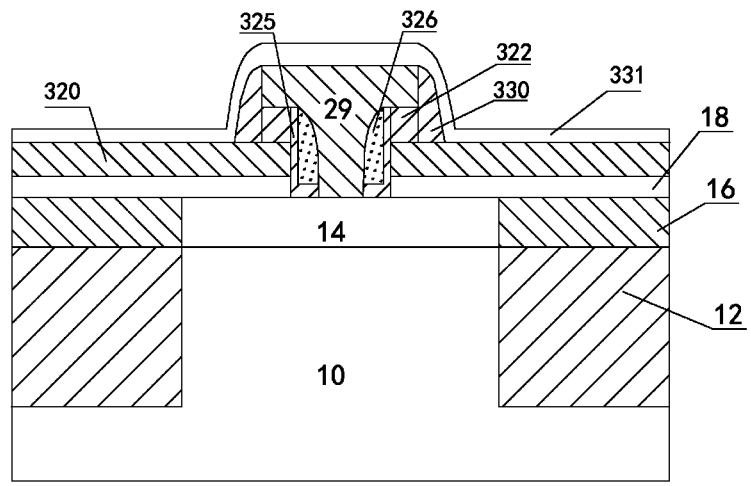

As shown in FIG. 31, a second metal layer 331 is deposited or sputtered. This metal layer may be made of but is not limited to Ti, Co or Ni.

Figure 32:
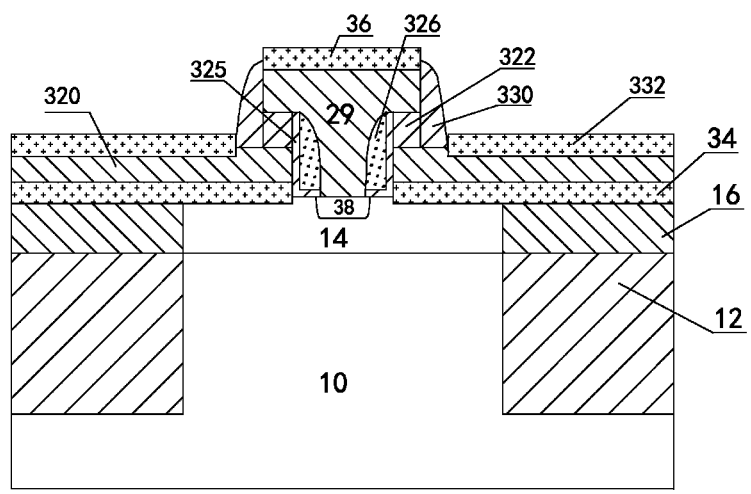

As shown in FIG. 32, by using one step or more steps of rapid thermal annealing process, the first metal layer 18 is enabled to make a silicification reaction with a portion of the monocrystalline base region 14 and the polycrystalline base region 16 which are beneath and in contact with the first metal layer 18 and the polysilicon elevated extrinsic base region 320 which is above and in contact with the first metal layer 18, respectively, to form a base-region low-resistance metal silicide layer 34. The base-region low-resistance metal silicide layer 34 may be but is not limited to titanium silicide, cobalt silicide or nickel silicide. The second metal layer 331 is enabled to make a silicification reaction with the heavily doped polysilicon elevated extrinsic base region 320 in contact with the second metal layer 331 to obtain the extrinsic-base-region low-resistance metal silicide layer 332, and to make a silicification reaction with the polysilicon emitter region 29 in contact with the second metal layer 331 to obtain the polysilicon emitter-region low-resistance metal silicide layer 36.

At the same time as or before or after the aforesaid metal silicide process, by using thermal annealing process or thermal diffusion drive-in process, the impurities in the heavily doped polysilicon emitter region 29 of the first conduction type are diffused outwards and downwards via the emitter window to form the heavily doped monocrystalline emitter region 38 of the first conduction type.

Figure 33:
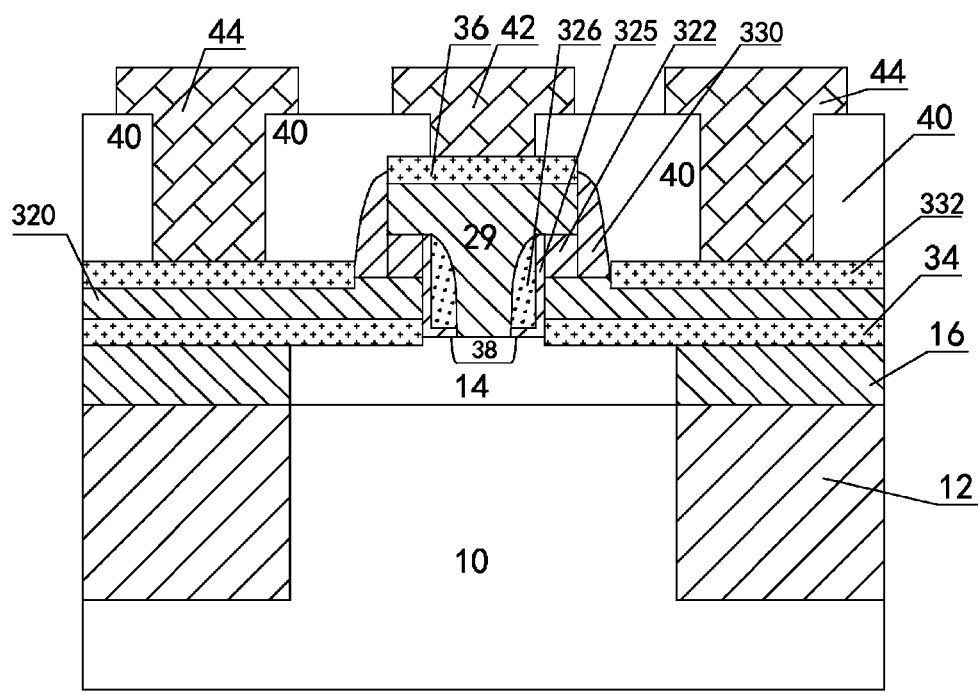

As shown in FIG. 33, back-end process of a conventional semiconductor device and an IC thereof including contact hole dielectric layer deposition contact hole photolithography and etching, interconnection metal layer sputtering, photolithography and etching and so on may be used to complete the process flow of forming the device. The reference number 40 represents the contact hole dielectric layer, and the reference numbers 42 and 44 represent the emitter metal electrode and the base metal electrode, respectively.

Because the present invention has no limitation on the leading-out manner of the collector, the leading-out electrode of the collector region is not shown in the attached drawings of the process flow of the above implementation. In practice, if the substrate (not shown) is a heavily doped Si wafer of the first conduction type, then the collector can be led out from the back surface of the heavily doped substrate; and if the substrate is a Si wafer of the second conduction type, then the collector can be led out through a conventional process such as from a heavily doped buried layer of the first conduction type (formed on the substrate of the second conduction type), on top of which the Si epitaxial layer and then the Si collector region 10 of the first conduction type are formed, via heavily doped collector Sinker to the collector metal electrode on the front surface of the wafer.

Preferred embodiment IV: as shown in FIG. 18 to FIG. 27 and FIG. 30 to FIG. 33, the local dielectric region 12 is formed by etching shallow trench in the Si epitaxial layer grown on a semiconductor substrate (not shown) and then filling with dielectric material therein, and a portion of the Si epitaxial layer in which the local dielectric region is not formed forms an Si collector region 10. The local dielectric region 12 is made of silicon oxide. A monocrystalline base region 14 of the second conduction type which is made of a epitaxial multilayer comprising Si and SiGe is formed on top of the Si collector region 10, and the polycrystalline base region 16 of the second conduction type which is made of a polycrystalline multilayer comprising Si and SiGe is formed on top of the local dielectric region 12.

A first Ti layer 18 is sputtered; a heavily doped first polysilicon layer 320 of the second conduction type is obtained through an in-situ doped deposition process; and a first silicon oxide layer 322 is deposited on the resulting structure. Middle portions of the first silicon oxide layer 322, the first polysilicon layer 320 and the first Ti metal layer 18 are selectively removed in sequence through photolithography to open the first window 321 which exposes the middle portion of the under monocrystalline base region 14. Remaining portions of the first polysilicon layer are called the polysilicon elevated extrinsic base region. A second silicon oxide layer 324 with a thickness of 10 nm is deposited. A silicon nitride inner sidewall 326 with a width of 100 nm is formed at the edge of the first window 321 by depositing a silicon nitride layer firstly and then carrying out an anisotropic etching process on the silicon nitride layer.

By using the silicon nitride inner sidewall 326 as a mask, portions of the second silicon oxide layer 324 which are not covered by the silicon nitride inner sidewall 326 are removed through a wet etching process to open the emitter window which exposes the middle portion of the monocrystalline base region 14 again. A second polysilicon layer 28 is deposited and then heavily doped into a second polysilicon layer 28 of the first conduction type by using an ion implantation process at a dosage of $5 \times 10^{15}/cm^2$ after deposition. Portions of the second polysilicon layer 28 and portions of the first silicon oxide layer 322 are etched off in sequence through photolithography to form the heavily doped polysilicon emitter region 29 of the first conduction type.

A silicon oxide outer sidewall 330 is formed outside the polysilicon emitter region 29 and remaining portions of the first silicon oxide layer 322 by depositing a silicon oxide layer firstly and then carrying out an anisotropic etching process on the silicon oxide layer. A second Ti metal layer 331 is sputtered on the resulting structure.

By using two steps of rapid thermal annealing process, the first Ti metal layer 18 is enabled to make a silicification reaction with a portion of the monocrystalline base region 14 and the polycrystalline base region 16 which are beneath and in contact with the first Ti metal layer 18 and the polysilicon elevated extrinsic base region 320 which is above and in contact with the first Ti metal layer 18, respectively, to form the base-region low-resistance Ti silicide layer 34. The second Ti metal layer 331 is enabled to make a silicification reaction with the heavily doped polysilicon elevated extrinsic base region 320 in contact with the second Ti metal layer 331 to obtain the extrinsic-base-region low-resistance Ti silicide layer 332, and to make a silicification reaction with the polysilicon emitter region 29 in contact with the second Ti metal layer 331 to obtain the polysilicon emitter-region low-resistance Ti silicide layer 36. At the same time, by using the thermal annealing process, the impurities in the heavily doped polysilicon emitter region 29 of the first conduction type are diffused outwards and downwards via the emitter window to form the heavily doped monocrystalline emitter region 38 of the first conduction type. The contact hole dielectric layer 40 is deposited and then etched through photolithography to form contact holes; and the interconnection metal layer is sputtered and then etched through photolithography to form the emitter metal electrode 42 and the base metal electrode 44. Finally, the process flow of forming the device is completed.

What are described above are only preferred embodiments of the present invention but are not intended to limit the scope of the present invention. Accordingly, any modifications or substitutions that can be readily devised by those skilled in the art within the technical scope of the present invention shall also fall within the scope of the present invention. Therefore, the protective scope of the present invention shall be governed by the claims.

What is claimed is:

1. A method of forming a metal silicide self-aligned SiGe heterojunction bipolar transistor, comprising at least the following steps:
    6.1 forming a Si epitaxial layer of a first conduction type and forming a local dielectric region in the resulting Si epitaxial layer, wherein a portion of the Si epitaxial layer in which the local dielectric region is not formed forms a Si collector region;
    6.2 forming a base region of a second conduction type on the resulting structure of the step 6.1, forming a monocrystalline base region on top of the Si collector region, and forming a polycrystalline base region on top of the local dielectric region, wherein the base region is a composite layer consisting of Si and SiGe;
    6.3 depositing or sputtering a first metal layer;
    6.4 depositing a first silicon oxide layer;
    6.5 selectively removing middle portions of the first silicon oxide layer and the first metal layer in sequence to form a first window which exposes the middle portion of the surface of the monocrystalline base region;
    6.6 depositing a second silicon oxide layer;
    6.7 depositing a silicon nitride layer and then forming a silicon nitride inner sidewall at the inner edge of the first window through an anisotropic etching process;
    6.8 removing portions of the second silicon oxide layer which are not covered by the silicon nitride inner sidewall to form an emitter-base spacer dielectric region composed of a liner silicon oxide layer and the silicon nitride inner sidewall, opening an emitter window enclosed by the emitter-base spacer dielectric region to expose the middle portion of the surface of the monocrystalline base region;
    6.9 depositing a polysilicon layer and heavily doping the polysilicon layer into a polysilicon layer of the first conduction type;
    6.10 forming a protection layer on the polysilicon layer and then etching off portions of the polysilicon layer and the first silicon oxide layer which are not masked by the protection layer to form a heavily doped polysilicon emitter region of the first conduction type;
    6.11 implanting ions of the second conduction type into the resulting structure of the step 6.10 to form a heavily doped monocrystalline base region and a heavily doped polycrystalline base region of the second conduction type by using the protection layer as a mask, and then removing the protection layer;
    6.12 enabling the first metal layer to make a silicification reaction with the heavily doped polycrystalline base region, the heavily doped monocrystalline base region and a portion of the monocrystalline base region, which are in contact with the first metal layer, respectively, to obtain a base-region low-resistance metal silicide layer; and diffusing the impurities in the heavily doped polysilicon emitter region of the first conduction type formed in the step 6.10 outwards and downwards via the emitter window to form a heavily doped monocrystalline emitter region of the first conduction type; and
    6.13 depositing a contact hole dielectric layer, forming contact holes, and leading out an emitter metal electrode and a base metal electrode.

2. The method of forming a metal silicide self-aligned SiGe heterojunction bipolar transistor of claim 1, wherein the step 6.12 of forming the base-region low-resistance metal silicide layer and the heavily doped monocrystalline emitter region comprises:
    6.12.1 depositing a third silicon oxide layer and then forming a silicon oxide outer sidewall through an anisotropic etching process;
    6.12.2 depositing or sputtering a second metal layer; and
    6.12.3 enabling the first metal layer to make a silicification reaction with the heavily doped polycrystalline base region, the heavily doped monocrystalline base region and a portion of the monocrystalline base region, which are in contact with the first metal layer, respectively, to obtain the base-region low-resistance metal silicide layer; enabling the second metal layer to make a silicification reaction with the polysilicon emitter region to form a polysilicon-emitter-region low-resistance metal silicide layer; removing portions of the second metal layer which make contact with the silicon oxide outer sidewall and have not made the silicification reaction; and diffusing the impurities in the heavily doped polysilicon emitter region of the first conduction type formed in the step 6.10 outwards and downwards via the emitter window to form the heavily doped monocrystalline emitter region of the first conduction type.

3. The method of forming a metal silicide self-aligned SiGe heterojunction bipolar transistor of claim 2, wherein the local dielectric region is formed in the Si epitaxial layer by etching shallow trench in the Si epitaxial layer and then filling with a dielectric material therein or through local oxidization.

4. The method of forming a metal silicide self-aligned SiGe heterojunction bipolar transistor of claim 2, wherein the metal layers are made of one of Ti, Co or Ni.

5. The method of forming a metal silicide self-aligned SiGe heterojunction bipolar transistor of claim 2, wherein the second silicon oxide layer has a thickness ranging between 5 nm and 50 nm.

6. The method of forming a metal silicide self-aligned SiGe heterojunction bipolar transistor of claim 2, wherein the silicon nitride inner sidewall is formed by firstly depositing the silicon nitride layer and then carrying out the anisotropic etching process on the silicon nitride layer, and the inner sidewall has a width ranging between 10 nm and 500 nm.

7. The method of forming a metal silicide self-aligned SiGe heterojunction bipolar transistor of claim 2, wherein the polysilicon layer is heavily doped into the polysilicon layer of the first conduction type by using an in-situ doping process during deposition of the polysilicon layer or by using an ion implantation process at a dosage greater than $10^{14}/cm^2$ after deposition.

8. The method of forming a metal silicide self-aligned SiGe heterojunction bipolar transistor of claim 2, wherein the base-region low-resistance metal silicide layer and/or the emitter-region low-resistance metal silicide layer are formed by using one step or more steps of rapid thermal annealing process; and the heavily doped monocrystalline emitter region is formed by using the one or more steps of the rapid thermal annealing process, or by using a rapid thermal annealing process or some other thermal diffusion drive-in process before or after the one or more steps of the rapid thermal annealing process.

9. The method of forming a metal silicide self-aligned SiGe heterojunction bipolar transistor of claim 1, wherein the local dielectric region is formed in the Si epitaxial layer by etching shallow trench in the Si epitaxial layer and then filling with a dielectric material therein or through local oxidization.

10. The method of forming a metal silicide self-aligned SiGe heterojunction bipolar transistor of claim 1, wherein the metal layers are made of one of Ti, Co or Ni.

11. The method of forming a metal silicide self-aligned SiGe heterojunction bipolar transistor of claim 1, wherein the second silicon oxide layer has a thickness ranging between 5 nm and 50 nm.

12. The method of forming a metal silicide self-aligned SiGe heterojunction bipolar transistor of claim 1, wherein the silicon nitride inner sidewall is formed by firstly depositing the silicon nitride layer and then carrying out the anisotropic etching process on the silicon nitride layer, and the inner sidewall has a width ranging between 10 nm and 500 nm.

13. The method of forming a metal silicide self-aligned SiGe heterojunction bipolar transistor of claim 1, wherein the polysilicon layer is heavily doped into the polysilicon layer of the first conduction type by using an in-situ doping process during deposition of the polysilicon layer or by using an ion implantation process at a dosage greater than $10^{14}/cm^2$ after deposition.

14. The method of forming a metal silicide self-aligned SiGe heterojunction bipolar transistor of claim 1, wherein the base-region low-resistance metal silicide layer is formed by using one step or more steps of rapid thermal annealing process; and the heavily doped monocrystalline emitter region is formed by using the one or more steps of the rapid thermal annealing process, or by using a rapid thermal annealing process or some other thermal diffusion drive-in process before or after the one or more steps of the rapid thermal annealing process.

15. A method of forming a metal silicide self-aligned SiGe heterojunction bipolar transistor, comprising at least the following steps:

8.1 forming a Si epitaxial layer of a first conduction type and forming a local dielectric region in the resulting Si epitaxial layer, wherein a portion of the Si epitaxial layer in which the local dielectric region is not formed forms a Si collector region;

8.2 forming a base region of a second conduction type on the resulting structure of the step 8.1, forming a monocrystalline base region on top of the Si collector region, and forming a polycrystalline base region on top of the local dielectric region, wherein the base region is a composite layer consisting of Si and SiGe;

8.3 depositing or sputtering a first metal layer;

8.4 depositing a first polysilicon layer to form a heavily doped first polysilicon layer of the second conduction type, and depositing a first silicon oxide layer on the first polysilicon layer;

8.5 selectively removing middle portions of the first silicon oxide layer, the first polysilicon layer and the first metal layer in sequence to form a first window which exposes the middle portion of the surface of the monocrystalline base region, with remaining portions of the first polysilicon layer forming a polysilicon elevated extrinsic base region;

8.6 depositing a second silicon oxide layer;

8.7 depositing a silicon nitride layer and then forming a silicon nitride inner sidewall at the inner edge of the first window through an anisotropic etching process;

8.8 removing portions of the second silicon oxide layer which are not covered by the silicon nitride inner sidewall to form an emitter-base spacer dielectric region composed of a liner silicon oxide layer and the silicon nitride inner sidewall, and opening an emitter window enclosed by the emitter-base spacer dielectric region to expose the middle portion of the surface of the monocrystalline base region;

8.9 depositing a second polysilicon layer and heavily doping the second polysilicon layer into a polysilicon layer of the first conduction type;

8.10 etching off portions of the second polysilicon layer and portions of the first silicon oxide layer to form a heavily doped polysilicon emitter region of the first conduction type;

8.11 enabling the metal layer to make a silicification reaction with the polycrystalline base region, a portion of the monocrystalline base region and the polysilicon elevated extrinsic base region, which are in contact with the metal layer, respectively, to obtain a base-region low-resistance metal silicide layer; and diffusing the impurities in the heavily doped polysilicon emitter region of the first conduction type formed in the step 8.10 outwards and downwards via the emitter window to form a heavily doped monocrystalline emitter region of the first conduction type; and 8.12 depositing a contact hole dielectric layer, forming contact holes, and leading out an emitter metal electrode and a base metal electrode.

16. The method of forming a metal silicide self-aligned SiGe heterojunction bipolar transistor of claim 15, wherein the step 8.11 of forming the base-region low-resistance metal silicide layer and the heavily doped monocrystalline emitter region comprises:

8.11.1 forming a silicon oxide outer sidewall outside the polysilicon emitter region and remaining portions of the first silicon oxide layer by depositing a silicon oxide layer firstly and then carrying out an anisotropic etching process on the silicon oxide layer;

8.11.2 depositing or sputtering a second metal layer on the resulting structure of the step 8.11.1; and 8.11.3 enabling the first metal layer to make a silicification reaction with the polycrystalline base region, a portion of the monocrystalline base region and the polysilicon elevated extrinsic base region, which are in contact with the first metal layer, respectively, to obtain the base-region low-resistance metal silicide layer; enabling the second metal layer to make a silicification reaction with the heavily doped polysilicon elevated extrinsic base region in contact with the second metal layer to obtain an extrinsic-base-region low-resistance metal silicide layer, and to make a silicification reaction with the polysilicon emitter region in contact with the second metal layer to form a polysilicon emitter-region low-resistance metal silicide layer; and diffusing the impurities in the heavily doped polysilicon emitter region of the first conduction type formed in the step 8.10 outwards and downwards via the emitter window to form the heavily doped monocrystalline emitter region of the first conduction type.

17. The method of forming a metal silicide self-aligned SiGe heterojunction bipolar transistor of claim 16, wherein the local dielectric region is formed in the Si epitaxial layer by etching shallow trench in the Si epitaxial layer and then filling with a dielectric material therein or through local oxidization.

18. The method of forming a metal silicide self-aligned SiGe heterojunction bipolar transistor of claim 16, wherein the metal layers are made of one of Ti, Co or Ni.

19. The method of forming a metal silicide self-aligned SiGe heterojunction bipolar transistor of claim 16, wherein the second silicon oxide layer has a thickness ranging between 5 nm and 50 nm.

20. The method of forming a metal silicide self-aligned SiGe heterojunction bipolar transistor of claim 16, wherein the silicon nitride inner sidewall is formed by firstly depositing the silicon nitride layer and then carrying out the anisotropic etching process on the silicon nitride layer, and the inner sidewall has a width ranging between 10 nm and 500 nm.

21. The method of forming a metal silicide self-aligned SiGe heterojunction bipolar transistor of claim 16, wherein the polysilicon layer is heavily doped into the polysilicon layer of the first conduction type by using an in-situ doping process during deposition of the polysilicon layer or by using an ion implantation process at a dosage greater than $10^{14}/cm^2$ after deposition.

22. The method of forming a metal silicide self-aligned SiGe heterojunction bipolar transistor of claim 16, wherein the base-region low-resistance metal silicide layer, the extrinsic-base-region low-resistance metal silicide layer and/or the emitter-region low-resistance metal silicide layer are formed by using one step or more steps of rapid thermal annealing process; and the heavily doped monocrystalline emitter region is formed by using the one or more steps of the rapid thermal annealing process, or by using a rapid thermal annealing process or some other thermal diffusion drive-in process before or after the one or more steps of the rapid thermal annealing process.

23. The method of forming a metal silicide self-aligned SiGe heterojunction bipolar transistor of claim 15, wherein the local dielectric region is formed in the Si epitaxial layer by etching shallow trench in the Si epitaxial layer and then filling with a dielectric material therein or through local oxidization.

24. The method of forming a metal silicide self-aligned SiGe heterojunction bipolar transistor of claim 15, wherein the metal layers are made of one of Ti, Co or Ni.

25. The method of forming a metal silicide self-aligned SiGe heterojunction bipolar transistor of claim 15, wherein the second silicon oxide layer has a thickness ranging between 5 nm and 50 nm.

26. The method of forming a metal silicide self-aligned SiGe heterojunction bipolar transistor of claim 15, wherein the silicon nitride inner sidewall is formed by firstly depositing the silicon nitride layer and then carrying out the anisotropic etching process on the silicon nitride layer, and the inner sidewall has a width ranging between 10 nm and 500 nm.

27. The method of forming a metal silicide self-aligned SiGe heterojunction bipolar transistor of claim 15, wherein the polysilicon layer is heavily doped into the polysilicon layer of the first conduction type by using an in-situ doping process during deposition of the polysilicon layer or by using an ion implantation process at a dosage greater than $10^{14}/cm^2$ after deposition.

28. The method of forming a metal silicide self-aligned SiGe heterojunction bipolar transistor of claim 15, wherein the base-region low-resistance metal silicide layer is formed by using one step or more steps of rapid thermal annealing process; and the heavily doped monocrystalline emitter region is formed by using the one or more steps of the rapid thermal annealing process, or by using a rapid thermal annealing process or some other thermal diffusion drive-in process before or after the one or more steps of the rapid thermal annealing process.

* * * * *